United States Patent
Goulding et al.

(10) Patent No.: US 11,741,289 B2
(45) Date of Patent: *Aug. 29, 2023

(54) ROUTING OF SUPERCONDUCTING WIRES

(71) Applicant: Microsoft Technology Licensing, LLC, Redmond, WA (US)

(72) Inventors: Michael B Goulding, Redmond, WA (US); Matus Lipka, Kirkland, WA (US); Kenneth Reneris, Kirkland, WA (US); Jason Lee, Savannah, GA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 56 days.

This patent is subject to a terminal disclaimer.

(21) Appl. No.: 17/242,193

(22) Filed: Apr. 27, 2021

(65) Prior Publication Data
US 2022/0343052 A1    Oct. 27, 2022

(51) Int. Cl.
*G06F 30/394* (2020.01)
*H01B 12/04* (2006.01)
*H10N 60/81* (2023.01)

(52) U.S. Cl.
CPC ........... *G06F 30/394* (2020.01); *H01B 12/04* (2013.01); *H10N 60/815* (2023.02)

(58) Field of Classification Search
USPC ....................................................... 716/126
See application file for complete search history.

(56) References Cited

U.S. PATENT DOCUMENTS

| 2004/0232912 A1 | 11/2004 | Tsukamoto et al. |
| 2015/0236235 A1 | 8/2015 | Ladizinsky et al. |
| 2016/0034609 A1 | 2/2016 | Herr et al. |
| 2022/0335198 A1* | 10/2022 | Accisano ............... G06N 5/003 |

OTHER PUBLICATIONS

Lin, et al., "Postrouting Optimization of the Working Clock Frequency of Single-Flux-Quantum Circuits", In the Journal of f IEEE Transactions on Applied Superconductivity, vol. 30, Issue 7, Oct. 2020, 14 Pages.

Lin, et al., "qGDR: A Via-Minimization-Oriented Routing Tool for Large-Scale Superconductive Single-Flux-Quantum Circuits", In the Journal of IEEE Transactions on Applied Superconductivity, vol. 29, Issue 7, Oct. 1, 2019, 12 Pages.

(Continued)

*Primary Examiner* — Bryce M Aisaka
(74) *Attorney, Agent, or Firm* — Fountainhead Law Group PC

(57) ABSTRACT

The present disclosure relates to routing superconducting wires in superconducting circuits and in particular to efficiently routing superconducting wires that meet inductance requirements. The superconducting wire routing technique involves modeling the target location not only as a physical location, but as a physical location (e.g., x, y, and z dimensions) combined with inductance (e.g., a target inductance range). One or more other constraints may also be included in the modeling, such as a number of wires that would need to be moved/lifted, a number of circuit-vias allowing passage through layers of the circuit, an amount of cross-coupling with other inductors, and a number of wire segments.

20 Claims, 13 Drawing Sheets

(56) References Cited

OTHER PUBLICATIONS

Nath, et al., "An Automatic Placement and Routing Methodology for Asynchronous SFQ Circuit Design", In the Journal of IEEE Transactions on Applied Superconductivity, vol. 30, Issue 3, Apr. 2020, 10 Pages.
"International Search Report and Written Opinion Issued in PCT Application No. PCT/US22/023225", dated Jul. 21, 2022, 14 Pages.
Tanaka, et al., "Automated Passive-Transmission-Line Routing Tool for Single-Flux-Quantum Circuits Based on A* Algorithm", In the Journal of IEICE Transactions on Electronics, Institute of Electronics, vol. E93C, Issue 4, Apr. 2010, pp. 435-439.
"Non Final Office Action Issued in U.S. Appl. No. 17/235,772", dated Jun. 27, 2022, 6 Pages.
"Notice of Allowance Issued in U.S. Appl. No. 17/235,772", dated Dec. 20, 2022, 5 Pages.
Fourie, et al., "ColdFlux Superconducting EDA and TCAD Tools Project: Overview and Progress", In Journal of IEEE Transactions on Applied Superconductivity vol. 29, Issue 5, Aug. 1, 2019, 7 Pages.
Jabbari, et al., "Global Interconnects in VLSI Complexity Single Flux Quantum Systems", In Proceedings of the Workshop on System-Level Interconnect: Problems and Pathfinding Workshop, Nov. 5, 2020, 7 Pages.
"International Search Report & Written Opinion issued in PCT Application No. PCT/US22/023179", dated Jul. 20, 2022, 12 Pages.
"Notice of Allowance Issued in U.S. Appl. No. 17/235,772", dated May 15, 2023, 5 Pages.

* cited by examiner

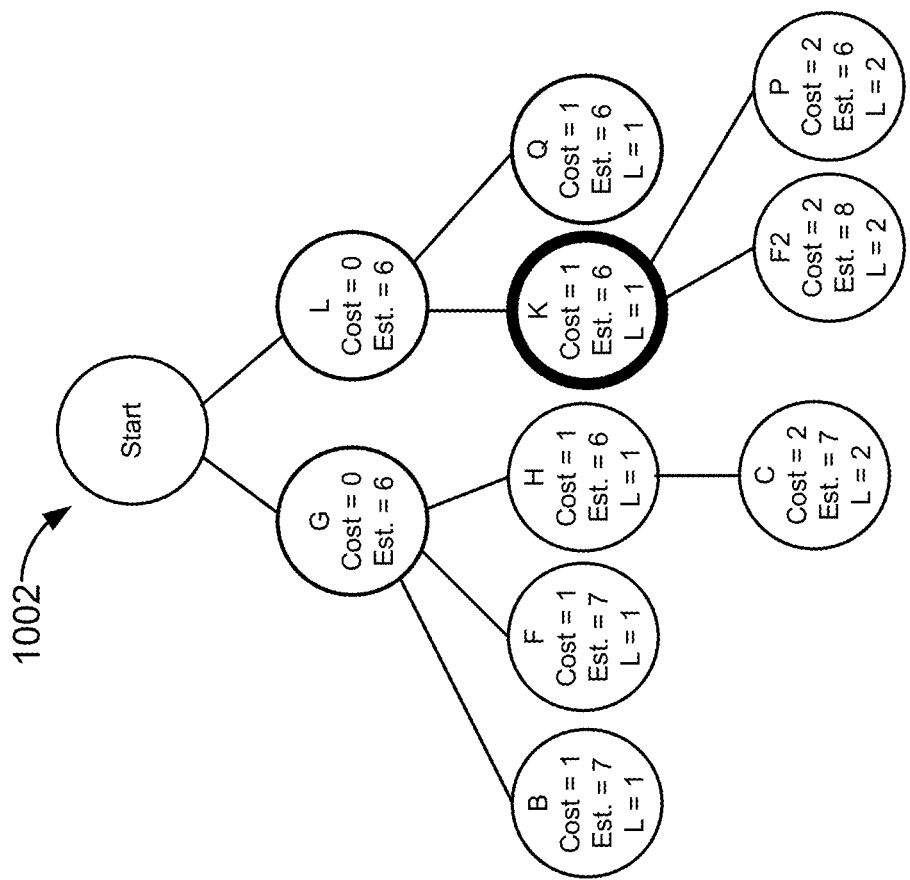
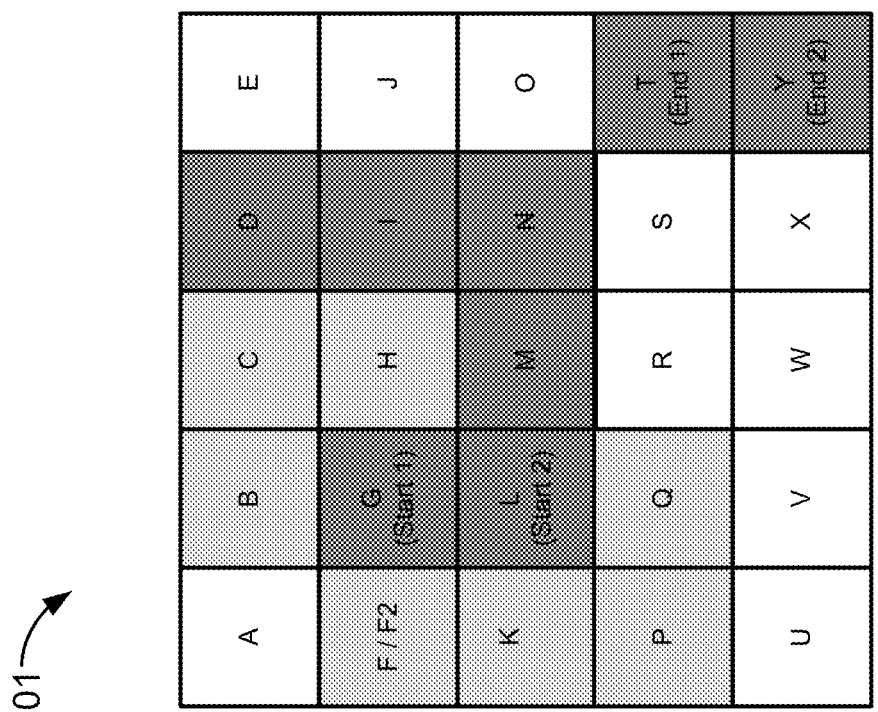
FIG. 10B
FIG. 10A

ROUTING OF SUPERCONDUCTING WIRES

BACKGROUND

The present disclosure relates to routing of superconducting wires in superconducting circuits and in particular to efficiently routing superconducting wires that meet inductance requirements and operating constraints. In this disclosure, the term "inductor" and the term "superconducting wire" are generally used interchangeably, though "wire" may refer to the metal on the circuit board and "inductor" may refer to the function of that metal, either in actual operation or as designed or simulated in an electronic design tool.

Superconductivity refers to a property of certain materials (e.g., niobium alloys) that can achieve zero electrical resistance at a critical temperature such that an electric current may persist indefinitely. Superconducting circuits, such as Single Flux Quantum based circuits, are electronic circuits implemented using superconductive devices (e.g., Josephson transmission lines including Josephson junctions) and inductors (e.g., superconductive wiring).

Superconducting devices may be configured to propagate or not propagate quantum flux pulses based on a DC bias, an AC clock, and a signal. Such devices may be performant within an operating margin. If the superconducting wires coupled to the superconducting device are outside of their target inductance range, the superconducting device may become overbiased or underbiased as a result. Accordingly, superconducting circuits may require that their inductors meet a target inductance in order to operate properly.

Superconducting circuits may be specifically designed to meet their inductance and other operational requirements using electronic design automation (EDA). EDA is a category of software tools for designing electronic systems such as integrated circuits and printed circuit boards. The tools work together so that chip designers can design and analyze complex interactions between potentially billions of components, making EDA tools important for the circuit design. For instance, EDA tools may be used to automatically route wires across the circuit between start and end locations. However, certain EDA tools may not be capable of efficiently routing superconducting wires that meet inductance requirements and other operating requirements of superconducting circuits. For example, certain EDA tools route wires using shortest-path techniques (e.g., Dijkstra's algorithm). Such algorithms may not be suited for routing superconducting wires because the shortest wires may not have sufficient inductance to meet the target inductance range.

Accordingly, there is a need for improved routing of superconducting wires that meets the operating requirements of the superconducting circuit.

SUMMARY

Embodiments of the present disclosure provide a computer system comprising one or more processors and a non-transitory computer readable storage medium coupled to the one or more processors. The storage medium having stored thereon program code that is executable by the one or more processors to receive one or more start locations and one or more end locations for a run of a superconducting wire in a circuit. The program code is further executable to iteratively determine a plurality of costs for a plurality of nodes forming paths from the one or more start locations to the one or more end locations. The costs are based on positions of current nodes along the paths and a target inductance for the wire run. The program code is further executable to iteratively store the plurality of costs in memory. The program code is further executable to select a subset of the plurality of nodes forming a final path between one of the one or more start locations and one of the one or more end locations, where the cost of the final path is the lowest cost of the plurality of costs and an inductance of the final path meets the target inductance.

Another embodiment provides a method for routing superconducting wire in a superconducting circuit. The method includes receiving one or more start locations and one or more end locations for a wire run. The method further includes iteratively determining a plurality of costs for a plurality of nodes forming paths from the one or more start locations to the one or more end locations. The costs are based on positions of current nodes along the paths and a target inductance for the wire run. The method further includes iteratively storing the plurality of costs in memory. The method further includes selecting a subset of the plurality of nodes forming a final path between one of the one or more start locations and one of the one or more end locations, where the cost of the final path is the lowest of the plurality of costs and an inductance of the final path meets the target inductance.

Another embodiment provides a non-transitory computer readable storage medium having stored thereon program code executable by a computer system. The program code is executable by the computer system to receive one or more start locations and one or more end locations for a wire run. The program code is further executable to iteratively determine a plurality of costs for a plurality of nodes forming paths from the one or more start locations to the one or more end locations. The costs are based on positions of current nodes along the paths and a target inductance for the wire run. The program code is further executable to iteratively store the plurality of costs in memory. The program code is further executable to select a subset of the plurality of nodes, the subset forming a final path between one of the one or more start locations and one of the one or more end locations, where the cost of the final path is the lowest of the plurality of costs and an inductance of the final path meets the target inductance.

BRIEF DESCRIPTION OF THE DRAWINGS

Various embodiments of the present disclosure are illustrated by way of example and not limitation in the figures of the accompanying drawings.

FIGS. 10A and 10B show a continuation of the search in FIGS. 9A and 9B.

DETAILED DESCRIPTION

Figure 1:
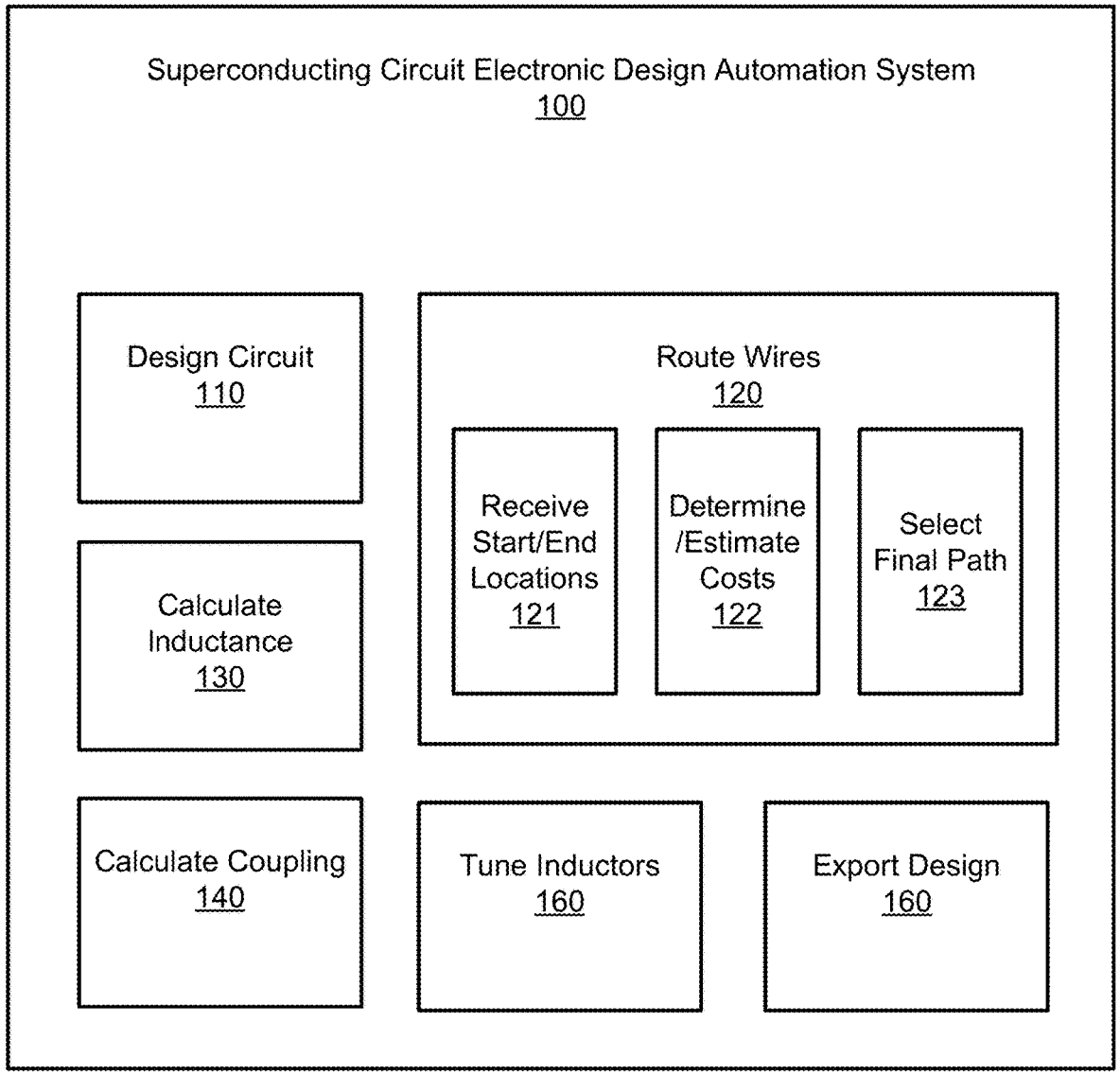
FIG. 1 shows a diagram of a superconducting circuit electronic design automation system, according to an embodiment.

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

As mentioned above, superconducting devices (e.g., Josephson transmission lines and Josephson junctions) may be configured to propagate or not propagate quantum flux pulses based on a DC bias, an AC clock, and a signal. Such devices may be performant within an operating margin. If the superconducting wires coupled to the superconducting device are outside of their target inductance range, the superconducting device may become overbiased or underbiased as a result. Accordingly, superconducting circuits may require that inductors meet a target inductance within a range in order to operate properly.

However, certain EDA tools may not be capable of efficiently routing superconducting wire inductors such that they meet inductance requirements and other operating requirements of superconducting circuits. For example, certain EDA tools route wires using shortest-path techniques (e.g., Dijkstra's algorithm). Such algorithms may not be suited for routing superconducting wires because the shortest wires may not have sufficient inductance to its target inductance range.

The techniques for routing superconducting wires described herein improve upon prior wire routing techniques (e.g., shortest path algorithms) by ensuring that the target self-inductance and other operational constraints are met. Furthermore, these techniques are efficient as the search is directed using a heuristic and it does not progress through routes that would not meet the target self inductance (e.g., too short or too long) or that would not meet other operations constraints (e.g., cross-coupling thresholds, requirement to via though a particular layer, etc.).

The superconducting wire routing technique described herein provides these improvements by modeling the target "location" as not only a physical location (e.g., x, y, and z dimensions) but physical location combined with inductance (e.g., a target inductance range). One or more other constraints may also be included in the modeling, such as a number of wires that would need to be moved/lifted, a number of circuit-vias allowing passage through layers of the circuit, an amount of cross-coupling with other inductors, and a number of wire segments, for example. Thus, each step in the search may change not only the physical location of the tail the search (e.g., the expanding portion of the wire route that is being considered in the search) but also the value of the constraints along the other dimensions.

This modeling technique allows the search algorithm to have multiple nodes in the same physical location if other dimensions such as inductance are different. In some cases, the routing/search algorithm may determine that two locations (search nodes) are functionally equivalent and remove the one with the higher cost in the search queue. For example, two nodes may be reduced to the one node having the lowest cost if the two nodes have the same physical location and the same inductance range or a similar inductance range overlapping by a threshold amount.

The search algorithm may also create additional edges that include actions like moving other wires (e.g., to another layer) that are in the way such that those edges are given a high cost and may be explored later if all cheaper search paths are exhausted. Any moved wires may then be re-routed after the primary route is solved. The solution of those moved wires might include more lifted wires that also need to be solved. If any moved wires cannot be solved, the primary route may be determined to have no solution. Otherwise, the primary route and all replaced wires are included as the routing "solution" applied to the design of the circuit.

Before going into further detail on the search algorithm, the system and tools used to design the circuit and route the wires will be described. FIG. 1 shows a diagram of a superconducting circuit electronic design automation (EDA) system, according to an embodiment. The EDA system 100 may be a system for creating superconducting circuit hardware designs based on sets of instructions. The EDA system 100 is an example of an electronic design automation (EDA) tool for designing electronic systems such as integrated circuits and printed circuit boards. The EDA system 100 may be implemented by a computing system (e.g., a system of one or more computers) and executing software to perform functions to Design Circuits 110, Route Wires 120, Calculate Inductance 130, Calculate Coupling 140, Tune Inductors 150, and Export Design 160. These functions may be used to design a circuit that may be manufactured. Discussion of the superconducting circuit and its components herein typically refers to the circuit as designed and simulated by the EDA system 100, unless stated otherwise.

The Design Circuit 110 functionality may obtain sets of instructions defining functionality of the circuit. The EDA system may obtain these instructions and covert them into a hardware circuit design that when manufactured would achieve the intended operations and results of the instructions. This design may also be reviewed and modified by a user before a finalized design is created for manufacturing.

The Route Wires 120 functionality may be performed during or after the design of the other portions of the circuit. The wires may link the other circuit components to transmit signals or information. The routing of wires for superconductor circuits is different from routing wires for Complementary metal-oxide-semiconductor (CMOS). For instance, CMOS circuits typically find the shortest paths for routing wires. However, the shortest path technique may not work when routing superconducting wires because superconducting wires are inductors having inductance based on the geometry of the wire. As such, superconducting wires may need to be routed in a path that is longer than the shortest path in order to meet a target self-inductance (e.g., an operating range of inductance values). A longer length of superconducting wire may have a higher self-inductance compared to a shorter length of superconducting wire. A wider (e.g., larger radius) superconducting wire may have a lower self-inductance compared to a narrower (e.g., smaller radius) superconducting wire. In some embodiments, the superconducting wires may be initially routed using a predetermined width across the length of the wire. The predetermined width may be a maximum width set by a manufacturer, for example, or it may be a width as set within the EDA system 100.

Figure 2:
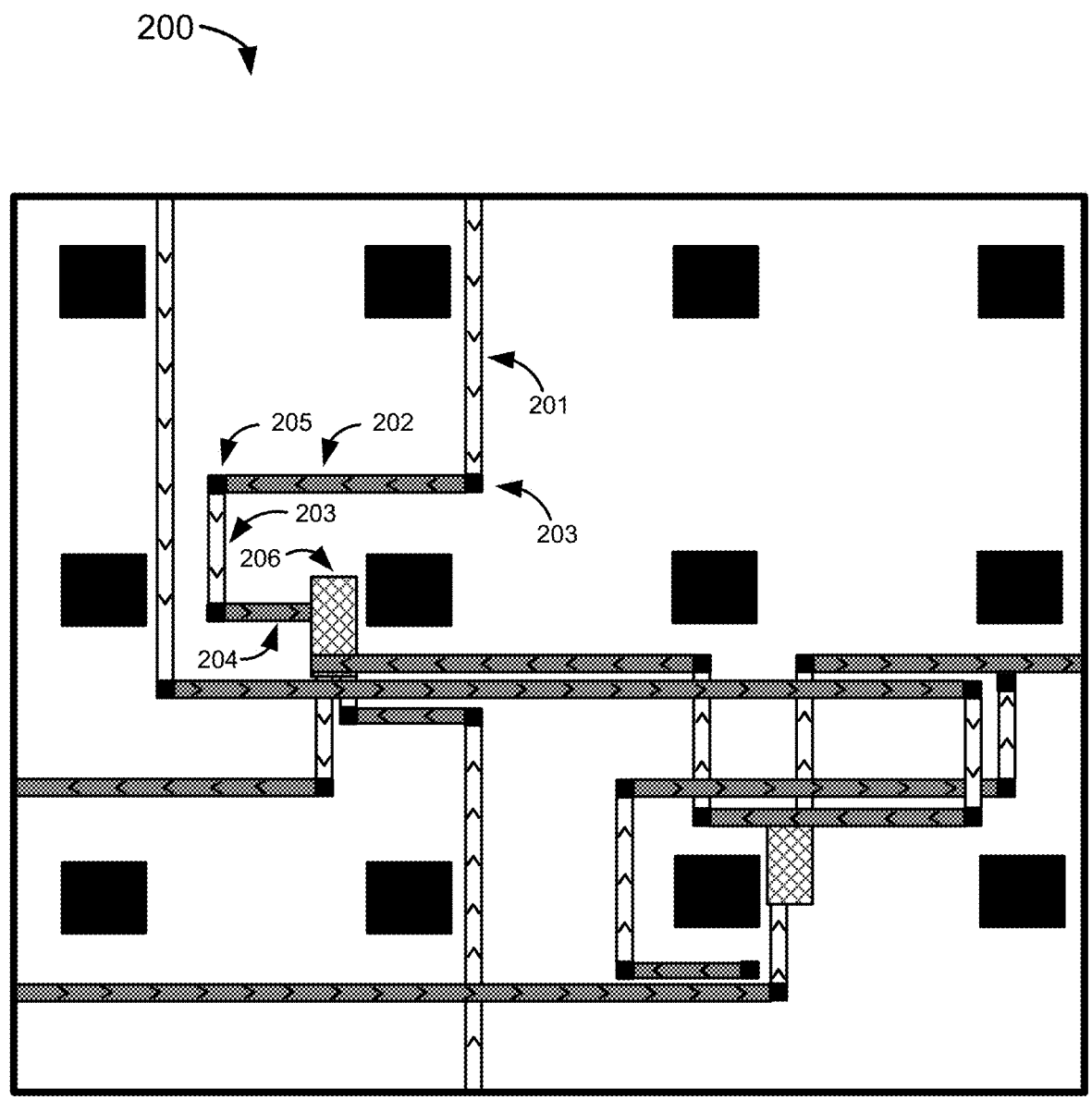
FIG. 2 shows a diagram of superconducting wires routed between components of a superconducting circuit, according to an embodiment.

The Route Wires 120 functionality may be configured to efficiently route superconducting wires between superconducting devices while meeting target inductance requirements and other operating requirements and constraints of the superconducting devices. FIG. 2 shows a diagram 200 of superconducting wires routed between components of a superconducting circuit, according to an embodiment. In this example, the superconducting wires are routed across two layers of a superconducting circuit. Each layer of the circuit may include conductive material affixed to insulating material. In diagram 200, a first layer has tracks going on one direction, left to right, and a second layer has tracks going in another direction, up and down. The wiring may be affixed along these tracks. The arrow markings along the wire segments show the direction that current travels. Accordingly, the wiring may need to pass through to the other layer using a circuit-via in order to change directions.

For example, a first wire segment 201 on the second layer may be connected to a second wire segment 202 on the first layer using a circuit-via 203 between the first layer and the second layer. The term "segment" refers to a portion of a wire along one layer that is connected to two circuit-vias, or that is connected to a circuit-via and a component of the superconducting circuit (e.g., a superconducting device). Each time the wire changes direction, a new segment begins. In diagram 200, the second segment 202 on the first layer is connected to a third segment 203 on the second layer, which is connected to a fourth segment 204 on the first layer, which is connected to a pin of a component 206 (e.g., a Josephson transmission line) of the superconducting circuit.

Figure 3A:
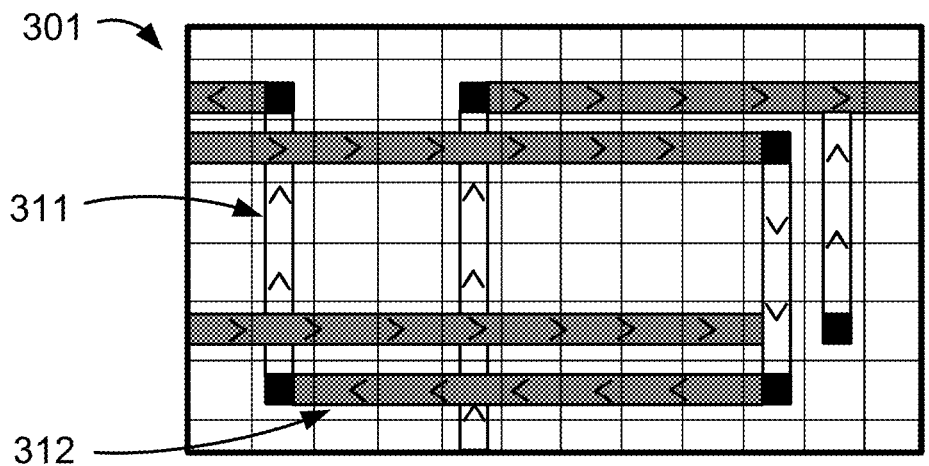
FIGS. 3A, 3B, and 3C show diagrams of superconducting wires routed along tracks and across layers of a superconducting circuit, according to an embodiment.
Figure 3B:
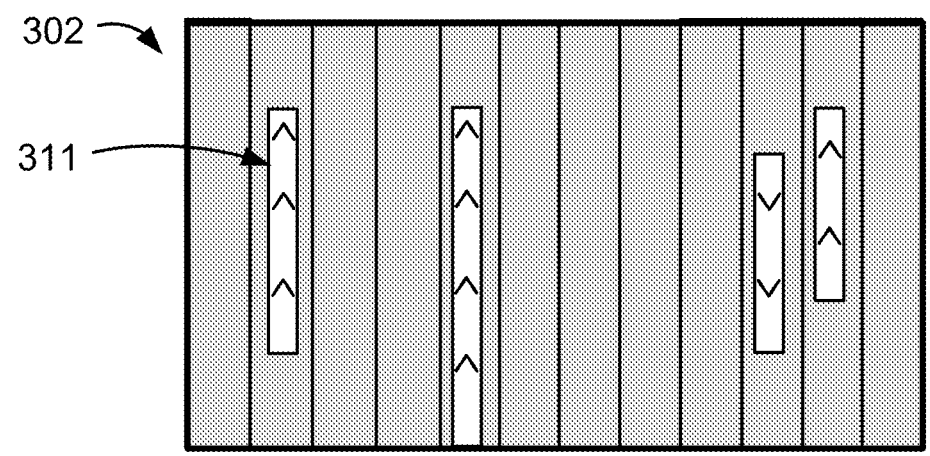
Figure 3C:
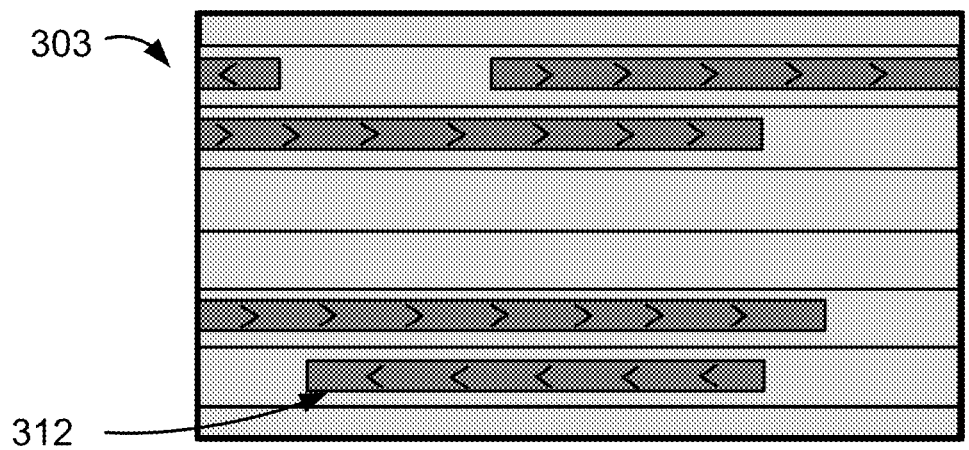

The Route Wires 120 functionality may incrementally route the wiring along these tracks using "wirepieces." A grid may be determined by conceptually superimposing two layers having tracks going in different directions. The size or length of each wirepiece may correspond to the cell intersections of the grid. FIGS. 3A, 3B, and 3C show diagrams 301, 302, 303 of superconducting wires routed along tracks and across layers of a superconducting circuit, according to an embodiment. Diagram 301 shows wiring routed across two layers having tracks going in different directions. Diagram 302 shows a portion of the wiring in diagram 301 that is on a first layer, which has tracks going up and down. Diagram 303 shows a portion of the wiring in diagram 301 that is on a second layer, which has tracks going right to left. For instance, diagram 301 shows a first wire segment 311, which is on the first layer, being connected to a second wire segment 312, which is on the second layer. Diagram 302 shows the tracks of the first layer of the circuit and the same first wire segment 311. Diagram 303 shows the tracks of the second layer of the circuit and the same second wire segment 312.

The intersections of the tracks of the first layer and the second layer are shown as a grid in diagram 301. This grid may be used to incrementally route wiring as "wirepieces," where each wirepiece is no longer than one square or intersection of the grid. For instance, the first wire segment 311 is comprised of six wirepieces. The first and last wirepieces being connected to vias and four wirepieces connected in between those. These six wire pieces forming a wire "segment." One or more segments of wire connecting components of the superconducting circuit may form a "run" of wire.

Referring back to FIG. 1, to efficiently route wires, the Route Wires 120 functionality includes functionality to Receive Start/End Locations 121 for routing a particular wire between one of a plurality of start locations and one of a plurality of end locations. For example, the Receive Start/End Locations 121 function may receive one or more start locations and one or more end locations for a run of a superconducting wire in a circuit. There may be multiple start and end locations used in the search as each Josephson junction may include a plurality of pins located at different positions on the layer of the circuit board (e.g., pins on the left and right sides of the Josephson junction).

When routing an inductor between two Josephson junctions, each pin of those junctions may be a suitable start or end location for a run of the superconducting wire. Furthermore, the search may be efficient as each of the start and end locations may be included within the same search. That is, multiple different path searches between each combination of start and end location may not be performed. Features and advantages of this technique is that the search is efficient since start locations having a higher estimated cost to get to one of the end locations may not be expanded as much in the search.

The Route Wires 120 functionality includes a Determine/Estimate Costs 122 functionality that may be used to determine a current cost of each search tail and estimate the remaining cost to each of the end locations. For instance, the Determine/Estimate Costs 122 functionality may iteratively determine a plurality of costs for a plurality of nodes forming paths from the one or more start locations to the one or more end locations, wherein the costs are based on positions of current nodes along the paths and a target inductance for the wire run. It may also iteratively store the plurality of costs in a memory. The current cost of a current node (e.g., the node currently being processed or examined in the search) may be determined based on an amount of wire placed so far. The amount may be based on a number of wire segments, corresponding to search nodes. In some embodiments, tracks of two circuit layers in different directions (e.g., vertical and horizontal) may be used to create a grid, where each wire segment may be the length of one square of the grid.

The estimate cost to one of the end locations may be determined using a heuristic. The estimate may be determined for each of the end locations. In some embodiments, the cost for each end location may be the greater of a number of wire pieces to each that end location (corresponding to a rectilinear physical distance or a "Manhattan" distance) and a minimum number of wire pieces need to hit a target inductance (e.g., an inductance range). The current inductance of the wire tail so far may be determined using the calculate inductance 130 functionality described below. The end location having the lowest estimated cost to it may be the estimated cost for a particular node in the search. The search algorithm is described in further detail below.

The Route Wires 120 functionality further includes Select Final Path 123 functionality that determines which node to use in expanding the search and that determines whether one of the end locations has been met. For instance, the Select Final Path 123 functionality may select a subset of the plurality of nodes forming a final path between one of the one or more start locations and one of the one or more end locations. The cost of the final path being the lowest cost of the plurality of costs for other paths to an end location. Furthermore, an inductance of the final path would meet the target inductance requirements. In some embodiments there may be further costs based on other factors. For example, the cost of a route may depend on whether the routing is along a preferred direction (or axis) for that layer (e.g., as shown in FIG. 3) vs. routing counter to that direction or axis (e.g., across the tracks). For instance, a wire may change directions without using a via between layers and instead going across the tracks. This type of routing may make it difficult to route other wires later and so there may be a high cost for such routing in the routing algorithm. Routing using a via between layers may also increase a cost for a path. Requiring another wire to be "lifted" or moved in order to travel in a particular direction may also increase the cost. A heatmap of coupling effects from previously routed inductors may also be used to increase the costs for routing in high-coupling effect areas. The search algorithm, determination of costs, and selection of the final path are described in further detail below.

The Route Wires 120 functionality may also consider that each superconducting device (e.g., Josephson transmission line or Josephson junction) may potentially have more than one wire connected to it, each with potentially with different self-inductances. Furthermore, each of those wires may be inductively coupled to other inductors (referred to as "cross coupling" or "noise"). Thus, changes to the geometry of one wire may affect other wires. Given this, the Route Wires 120 functionality of the EDA system 100 may rely on the Calculate Inductance 130 functionality and the Calculate Coupling 140 functionalities.

The Calculate Inductance 130 functionality may be configured to calculate the self-inductance of each wire based on its geometry as routed. The Calculation Inductance 130 functionality may account for changes to inductance resulting from the wires passing through a circuit-via (e.g., an electrical connection between layers in the circuit) as the superconducting wire may use such vias when changing direction. This may be the case in situations where the circuit is designed using layered directional tracks where tracks on a layer go in one direction and tracks in the layer above and below it go in a perpendicular direction.

The wiring between vias (or pins of superconducting devices) may be referred to as "segments" of wires. For example, a first superconducting device may be coupled to a second superconducting device using three segments of superconducting wire. The first segment may be connected to a pin of the first superconducting device and a first via, the second segment may be connected to the first via and a second via, and the third segment may be connected to the second via and a pin of the second superconducting device. The first segment and the second segment may be on different layers of the circuit. The second segment and the third segment may be on different layers of the circuit. The first segment and the third segment may be on the same or different layers of the circuit. The wire may change directions (e.g., 90°) each time it passes through a via since consecutive layers may have tracks in different directions.

Once the wires are routed, the minimum and maximum inductance of the wires may be computed based on the wire's geometry (e.g., using a maximum width and a minimum width). The Calculate Coupling 140 functionality may be configured to calculate an amount of the amount of flux coupled between two superconducting wire. The delta (difference) from the target inductance of the wire is then computed. Even if the inductor is already within the target inductance range for that wire, the delta from the target may be reduced by adjusting (tuning) the widths of various segments of the wire as further described below. Altering the width of individual wire segments (or partial segments) adjusts the self-inductance of the wire without altering is routed path.

As mentioned above, such cross coupling may cause superconducting devices (e.g., Josephson junctions) to become overbiased or underbiased outside of their operating margins, thereby causing malfunction. The Calculate Coupling 140 functionality may be further configured to calculate changes in coupling across the length of the wire.

Wire width is a contributing factor to the amount of flux coupled between two superconducting wires. Therefore, the coupling between two wires may be lowered by choosing particular portions along a given wire's path adjust the geometry of the wire (e.g., narrowing the wire). Coupling effects between wires may also impair the operating margins of the circuit and may lead to the failure of individual superconducting devices (e.g., Josephson junction) by over or under-biasing the superconducting device. Given this, a reduction in coupling effects may be needed in order to achieve the higher operating margins.

The Tune Inductors 150 functionality may be configured to adjust geometries of the superconducting wires, thereby adjusting their inductance, in order to meet the operating margins (e.g., inductance requirements) of the superconducting devices. For instance, a width of an inductor may be reduced (e.g., made thinner, or have a smaller radius) in order to increase an inductance of the inductor, unless doing so would exceed the target inductance of that inductor. The width of the inductor may also be increased, thereby reducing inductance. In some embodiments, there may be a discrete set of possible wire widths set by a manufacturer of superconducting circuits or by the EDA system 100. That is, increases and reductions in widths may not be smooth or linear.

Once the design of the superconducting circuit has been set such that the superconducting devices are within their operating margins and the inductors are within their target inductance range, the design may be exported to manufacturing. The Export Design 160 functionality is configured to format information for designing the circuit according to a manufacture's requirements. This information may be provided to the manufacturer and the circuit may be fabricated. By implementing the improved superconducting wire routing techniques described herein, such circuits may have higher operating margins and be less likely to malfunction as the superconducting wires have been routed to meet their target inductance requirements.

Figure 4:
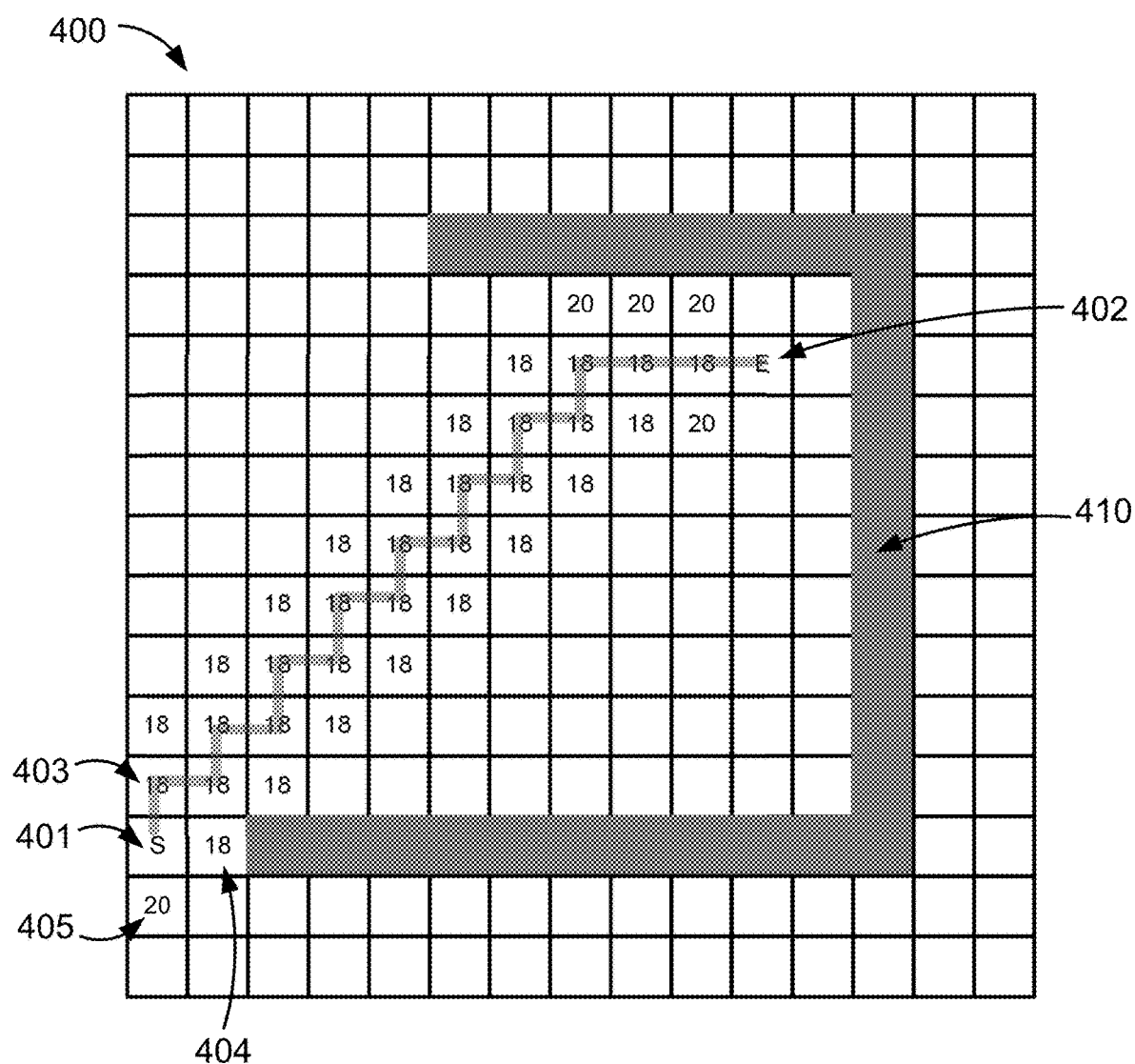
FIG. 4 shows a diagram of a path finding search algorithm.

As mentioned above, certain prior wire routing techniques seek the shortest physical path between a start location and an end location, while the improved superconducting wire routing techniques also ensure that inductance requirements and other constraints are met. Prior to discussing the improved superconducting wire routing search, a simplified shortest path algorithm is described. FIG. 4 shows a diagram 400 of a path finding search algorithm. The search algorithm shown in diagram 400 is an informed best-first search algorithm, such as the A* ("A-star") search algorithm, that uses a heuristic to estimate the total cost to the end location from a current node in the search. The grid shown in diagram 400 corresponds to a physical area with each cell of the grid being a distinct location that is a potential node in the search.

In the grid, the best-first search algorithm begins at the start node "S" 401 and considers all adjacent cells, populating a queue of nodes in the search sorted by cost. Nodes that are inaccessible (e.g., due to walls, obstacles, out of bounds, etc.) may be filtered out. In diagram 400, nodes that are obstacles are shown in dark grey, such as node 410. The search algorithm then picks the cell from the queue having the lowest cost, which is estimated. This process is iteratively repeated until the shortest path has been found to the target end node "E" 402. The estimated cost may be computed using an admissible heuristic that gives good results and which does not overestimate the costs (e.g., the estimated cost is the same or less than the actual cost).

In this example, the search begins at start location "S" 401 and seeks a path to the end location "E" 402 without diagonal segments. That is, the path may go left, right, up, or down from the current node. Beginning with the start location 401 as the current node, the search algorithm determines the estimated cost to the end location 402 from the start through each neighboring node (e.g., adjacent node) of the current node. As shown in diagram 400, a third node 403, a fourth node 404, and a fifth node 405 are neighbors of the start node 401. These neighboring nodes may be added to a search queue and the search may continue from the node having the lowest cost within the queue.

The cost for a particular node n may be calculated as the cost to reach the node n from the start node S added with the estimated cost to go from node n to the end node 402. A cost estimation function may be used to determine the estimated costs to the end location. For example, the estimated cost may be determined using the rectilinear distance (e.g., "Manhattan distance") from a node n to the end node. In this example, the cost to get to the third node 403 from the start node 401 is 1 and the rectilinear distance from the third node 403 to the end node 402 is 17. Accordingly, the cost for the third node 403 is 18 (1+17). The cost for the fourth node 404 is also 18 as the path through the fourth node 404 is moving towards the end node 402. The cost for the fifth node is 20 as it is 1 unit away from the start node 401 and has a rectilinear distance of 19 to the end node 402.

After determining the costs for each neighboring node of the current node, the search is expanded to the neighboring node having the lowest cost, making it the current node and repeating this process. In this example, the third node 403 and the fourth node 404 have a cost of 18 while the fifth node has a cost of 20. Accordingly, the search algorithm may select either the third node 403 or the fourth node 404 to be expanded. In this example, the search algorithm makes the third node 403 the current node. The current node at each iteration of the search is shown by a gray line routed through the nodes (cells of the grid). As shown in diagram 400, the search continues to iteratively determine costs for each neighbor of the current node using an estimated distance to the end node 402 and then expand one of the nodes having the lowest cost. Thus, the shortest path from the start node 401 to the end node 402 may be found. Other paths having the same lowest cost may exist but may be left out of the search algorithm for the sake of efficiency.

As mentioned above, shortest path algorithms may not be suited for routing superconducting wires because the shortest wires may not have sufficient inductance to meet the wires inductance requirements. For example, the shortest path algorithm shown in diagram 400 may only be a valid solution for routing a superconducting wire if having a length of 18 would put the wire within the target inductance range. If the target inductance is greater or lower than the inductance provided by the shortest path wire then the shortest path may not ensure proper operation of the coupled superconducting device. Instead of taking the shortest path, the route may be meandered in order to reach the target inductance requirement (e.g., inductance range).

In order to route wires such that they meet target inductance requirements and other constraints, a best-first algorithm may be modified to use inductance as a dimension of the search in addition to using physical position (e.g., x, y, and z coordinates) as dimensions. Inductance may also be used to determine the costs of the nodes such that the length of the wire meets the inductance requirements.

Figure 5:
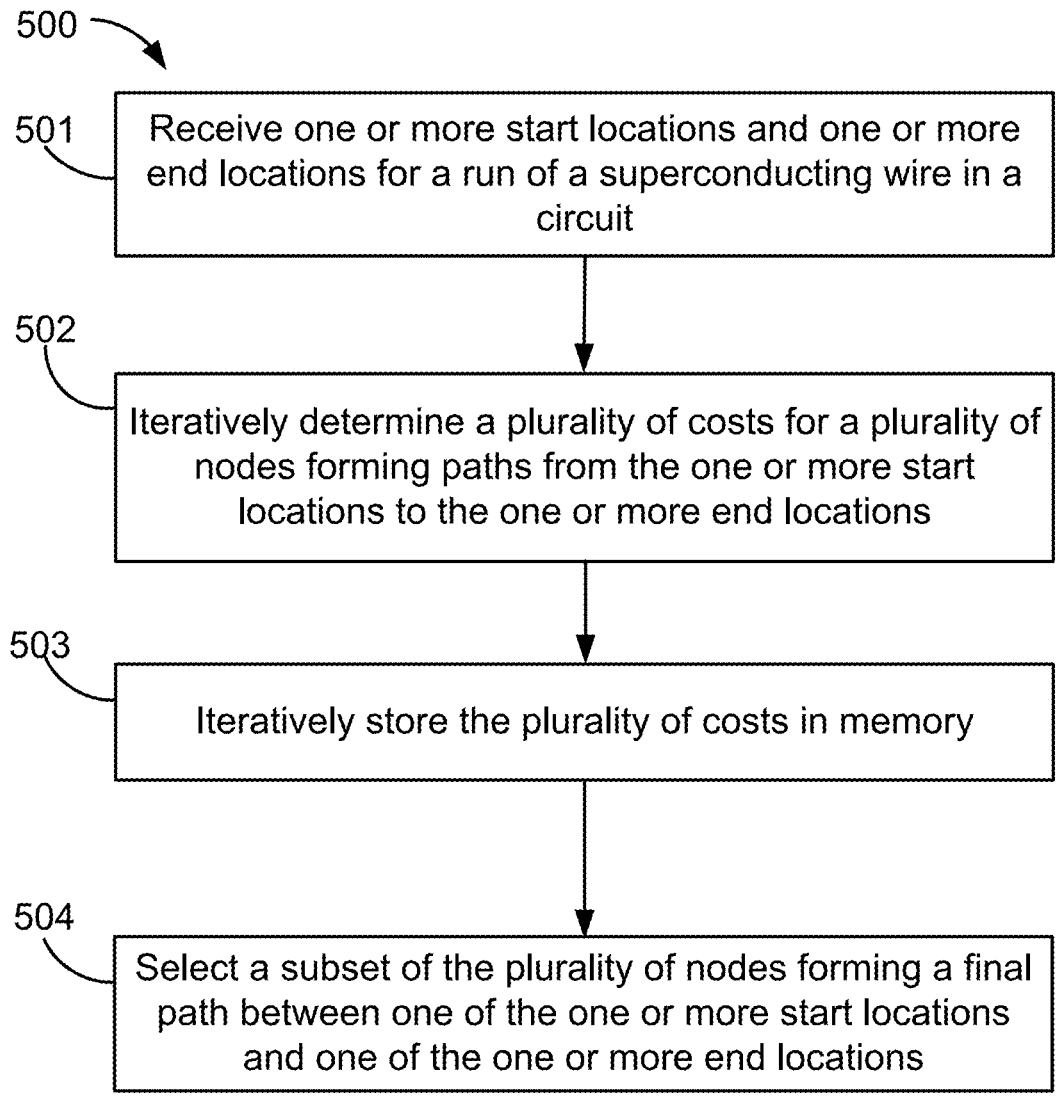
FIG. 5 shows a flowchart of an improved path finding method for routing superconducting wires, according to an embodiment.

FIG. 5 shows a flowchart 500 of an improved path finding method for routing superconducting wires, according to an embodiment. This method may be used to efficiently route superconducting wires between superconducting devices while meeting target inductance requirements and other operating requirements and constraints of the superconducting devices.

At 501, the method receives one or more start locations and one or more end locations for a wire run. The one or more start locations correspond to pins of a Josephson junction or pins of a device, and wherein the one or more end locations correspond to pins of another Josephson junction or pins of another device. The method may add the one or more start locations to a search set (e.g., a search queue) and then iteratively add neighboring nodes to the search set if the neighboring nodes a meet a set of constraints and would not exceed the target inductance.

In some embodiments, a preliminary shortest path search may be performed before determining a plurality of costs for a plurality of nodes based on a target inductance as in 502. The preliminary shortest path search may use a computationally simpler algorithm to determine whether any path between the start and end locations exists before starting the more computationally complex search algorithm described below. If no path exists, the complex search algorithm may be skipped.

At 502, the method iteratively determines a plurality of costs for a plurality of nodes forming paths from the one or more start locations to the one or more end locations. The costs are based on positions of current nodes along the paths and a target inductance for the wire run. The plurality of costs are determined based on a physical length of a wirepath, an estimated physical distance to one of the one or more end locations, a current inductance of the wirepath, and an estimated distance of additional wirepath needed to meet the target inductance. For example, the paths from the one or more start locations to the one or more end locations may be incrementally expanded out one wirepiece at a time based on the cost of the current node being considered and the estimated cost to reach one of the one or more end locations. The cost of the current node may be based on the number of wire pieces used (corresponding to the length) in the wirepath tail. The cost may also be based on a number of vias along the paths. The estimated physical distance may be a number of wirepieces needed to reach one of the one or more end locations. That is, the rectilinear distance using wirepieces along tracks. The current inductance of the wirepath tail being considered may be determined by the EDA tool based on the length and geometry of the wirepath tail. The EDA tool may also consider cross-coupling between other inductors, which may affect inductance. The estimated distance of additional wirepath needed to meet the target inductance may be determined based on the current inductance and a predetermined estimate of the amount of inductance provided by a single wirepiece. The target inductance may be a range comprising a lower inductance and a higher inductance.

In some embodiments, the method may determine a first cost based on a minimum length of wire between a current node and the end location and determine a second cost based on a minimum length of wire to meet the target inductance. The method may then select a greater of the first cost and second cost as a cost of the current node. The method may also determine, when the first cost is selected, if an inductance corresponding to the minimum length of wire between the current node and the end location exceeds a threshold (e.g., an upper range value of a target inductance range) or if a constraint (e.g., cross-coupling thresholds, requirement to via though a particular layer, etc.) is violated. The current node may be invalidated if an inductance corresponding to the minimum length of wire between the current node and the end location exceeds the threshold. In some embodiments, the first cost and the second cost are determined for a plurality of target nodes (e.g., potential end nodes), and the method selects a lowest one of the plurality of costs corresponding to one target node of the plurality of target nodes.

In some embodiments, the plurality of costs for the plurality of nodes forming paths from the one or more start locations to the one or more end locations are determined based on a maximum width for the superconducting wire.

In some embodiments, the target inductance used to determine the second cost is an inductance value at an upper range of a range of target inductances.

At 503, the method further includes iteratively stores the plurality of costs in memory. The memory may be used as priority queue for the search. However, a current node may not be stored in memory if an inductance from a current start location to the current node exceeds a threshold. In some embodiments, the current node may not be stored in memory if a constraint (e.g., cross-coupling thresholds, requirement to via though a particular layer, etc.) is violated. That is, paths through a node which are not a solution may not be stored.

At 504, the method selects a subset of the plurality of nodes forming a final path between one of the one or more start locations and one of the one or more end locations, where the cost of the final path is the lowest of the plurality of costs and an inductance of the final path meets the target inductance. Thus the method can efficiently perform the search using the heuristic (e.g., estimated distance to the end or to meet the target inductance requirement) compared to certain search algorithms (e.g., breadth-first search) while also ensuring that the routed superconducting wires meet the target inductance requirements and other operational requirements and constraints of the superconducting circuit.

The method for routing superconducting wires described above may be implemented in an EDA tool to automatically route the wires. Pseudocode for implementing the method is provided in Listing 1 below:

Listing 1

```
function PerformSearch( SearchGraph searchGraph):
    gScoreMap := look up table that maps node locations to a
    recorded total cost from the start to that location with a default
    value of infinity for unset entries.
    openSet := a queue of Node objects ordered by cost.
    openSet.AddWithCost(0.0, searchGraph.GetStartNode( ))
    While !openSet.empty( )
        currentNode = openSet.PopCheapestItem( )
        if SearchGraph.IsGoal(currentNode):
            return currentNode
        else for each edge from
    searchGraph.GetNeighbors(currentNode):
            newNode = edge.destinationNode
```

-continued

Listing 1

```
            newCost = currentNode.cost + edge.cost
            previousRecordedCostForThisLocation =
    gScoreMap.getEntryOrDefault(newNode.location)
            if previousRecordedCostForThisLocation > newCost:
                // this node location is new or it is better than
    the previous, add it to the openSet
                gScoreMap[newNode.location] = newCost
                newEstimatedTotalCost = newCost +
    searhGraph.EstimateRemainingCost(newNode)
                openSet.AddWithCost(newEstimatedTotalCost, newNode)
    //end node not found.
    return failure
```

As mentioned in Listing 1, the "openSet" is a queue of "Node" objects ordered by cost. A Node object may contain the data of the wire route so far. The node object may contain the starting point and list of wire segments from that location to the current endpoint (called the "tail"). The "location" in the pseudo code is a combination of the current physical location on a wiring track (e.g., x-dimension, y-dimension) on a certain layer (e.g., z-dimension), and the current inductance range that list of wire segments might take on (may be called an L-dimension as L stands for inductance). When the code compares or looks up a node location, it checks the physical position and the range of inductance to see if both match. For the inductance range, matching is "fuzzy" (e.g., overlapping by a threshold amount or percentage), while physical location may be matched exactly. An inductance range may be used since the inductance may change depending on the width of the wire on the layer. The width of each segment, or parts of each segment, may be modified to change the overall inductance of that wire. Accordingly, an inductance range is used instead of a single inductance value for the route.

The function "searchGraph.GetStartNode( )" returns a node that has "neighbors" that are all the possible starting locations for the wire being routed. As an alternative, a collection of starting nodes could be added to the queue.

The function "searchGraph.IsGoal(currentNode)" checks whether the current node is an end node. For example it may check whether the node is a valid ending physical location and whether the wire meets the target inductance range. That is, may the wire be sized (wider or narrower) such that the target inductance of the wire is within the range. Other constraints may also be checked by this function, including a more rigorous calculation of the given inductance of the routed path (e.g., including cross coupling).

The function "searchGraph.GetNeighbors(currentNode)" takes the current node and creates copies of it, appending to each copy a new wirepiece along the track in each direction if movement is possible and not obstructed. This includes moving up and down through the layers, using vias. The possibility of moving in a particular direction may include considering various constraints, such as checking that the newly added wirepiece does not make the wire too long to be able to fit into the target inductance range. The "tail" of each node is updated to reflect the new piece added. For each node, if the node is considered valid (possible), then the node is then added to a newly created "edge" object where the cost of the new piece is calculated and added to the node's current cost value. This list of edges is then returned to the search algorithm.

The function "searchGraph.EstimateRemainingCost (newNode)" calculates the "distance" between the newNode tail and the cheapest end location. For each target location, two costs are calculated: the minimum number of wire pieces that are needed to go from the newNodeTail to the target location and the minimum number of wire pieces that are needed to each the target inductance for this wire. If the target inductance is already within range, this may be zero. The greater of these two numbers is returned for each target location, and the smallest cost out of all the targets is returned. The target location with the smallest cost may change over time.

Example Search for a Wire Path

Figures 6A, 6B:
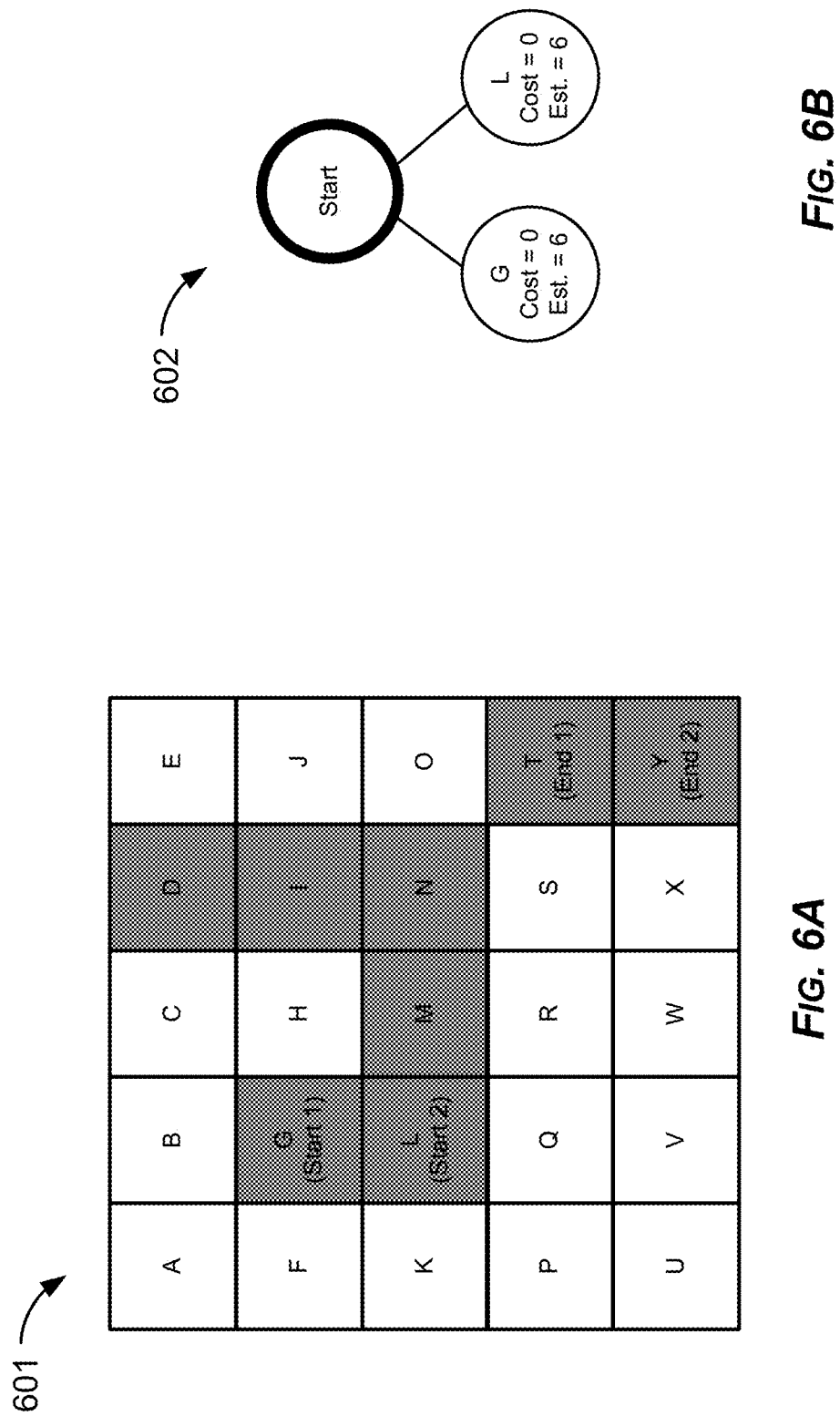
FIGS. 6A and 6B illustrate a search for a final path between one of two start locations and one of two end locations that meets a target inductance, according to an embodiment.

An example search for routing a superconducting wire using the improved superconducting wire routing techniques described above is now provided with respect to FIGS. 6-11. This example search is performed using the method described above with respect to FIG. 5. The search may also be performing using code based on the pseudocode described above. In this example, the physical search space and the cost calculations have been simplified for ease of explanation. FIGS. 6A and 6B illustrate a search for a final path between one of two start locations and one of two end locations that meets a target inductance, according to an embodiment. The grid 601 shown in FIG. 6A illustrates the physical space being searched while the graph 602 in FIG. 6B illustrates the search queue.

First, a search function receives one or more start locations and one or more end locations for a run of a superconducting wire in a circuit. These start and end locations may be positioned as shown on the grid 601, which includes cells labeled "A" through "Y," which may correspond to an intersection of layer tracks as discussed above with respect to FIG. 3. That is, the grid 601 corresponds to two layers having tracks going in different directions. For each of illustration, the tracks of the two layers are superimposed as a grid.

The two start locations are Start 1 (cell G) and Start 2 (cell L). The two end locations are End 1 (cell T) and End 2 (cell Y). These cells may correspond to the location of pins of a superconducting device, for example. These cells are filled with a dark gray color, which indicates that the cell is a path-obstruction. For example, a wire may not be routed across a pin of the superconducting device unless the wire is coupled to that device. Other obstructions shown in cells D, I, M, N, T, and Y may be other components or wiring in the superconducting circuit. In this example, for simplicity, the target inductance range is 6 to 7 units of inductance and each wirepiece routed over a cell of the grid 602 adds 1 unit of inductance at a predetermined width for routing. In this example, the inductance added by a wirepiece is 1 (e.g., at the predetermined width), whether using a via to change directions or continuing along the same track.

The graph 602 corresponds to the grid 601. The graph 602 shows the search space as the search from the start cells to the end cells iteratively progresses. Cells that are adjacent (but not diagonal) in the grid 601 are connected by an edge in the graph 602. The graph 602 shows the nodes that have been added to the queue, or "open set." The open set may be a queue of nodes ordered by cost from lowest to highest where the lowest cost nodes are at the front of the queue.

While each node in the graph 602 corresponds to a particular cell of the grid 601, there may be multiple nodes in the graph 602 that correspond to the same cell of the grid 601. This is because nodes are defined not only by the physical location within the grid, but by the inductance of a wire routed to the node as well. For example, each node may include the state of the tail including physical location (e.g., in the grid and on which layer), the inductance range of the wire (e.g., a minimum possible inductance using a widest possible wire and a maximum possible inductance using a narrowest possible wire), whether and which other wires were lifted, the circuit-vias used in routing the wire, an amount of cross-coupling with other inductors, and the segments of the wire.

The graph 602 shows the search graph with a special "Start" node having neighbors that are all of the possible starting locations for the wire being routed. In this example, cell G and cell L are the possible starting locations and have been added to the open set. The start nodes G and L may be added to the open set using the "GetStartNode( )" function discussed above, for example. The cost of the starting nodes may be set to 0 such that these nodes are expanded before other nodes in the graph. The cost may be set using the "openSet.AddWithCost( )" function discussed above, for example.

After adding the start nodes, the search may iteratively determine a plurality of costs for a plurality of nodes forming paths from the one or more start locations to the one or more end locations. The costs being based on positions of current nodes along the paths and a target inductance for the wire run. This process corresponds to the sets of instructions within the "while !openSet.empty( )" portion of the pseudocode above.

Each node may be associated with the cost to get to that node from a start node. The cost to get to a node may be based on the physical length of the wirepath in that path so far. In this example, node G and node L both have a cost of 0 to reach that node because they are start locations. That is, the "currentNode.cost" for Nodes G and L is 0 ("Cost=0" in graph 602).

The estimated remaining cost for each of the start nodes is then determined. The estimated remaining cost may be determined based on positions of current nodes along the paths and a target inductance for the wire run. The position of the node in the graph 602 is represented as the corresponding cell on the grid 601 and a heuristic (e.g., rectilinear distance or Manhattan distance) may be used to determine a minimum length of wire needed to reach one of the end locations.

The estimated total cost for the node may be based on the greater of an estimated physical distance to one of the one or more end locations and an estimated distance of additional wirepath needed to meet the target inductance. Node G is 5 cells from node T, which is less than the minimum of 6 wirepieces needed to reach the lower range value of 6 of the target instance range (6 to 7). The greater of the minimum number of wirepieces needed to reach the end location and the minimum number of wirepieces to reach the lower range of the target inductance may be used as the estimated total cost. For node G, a minimum of 6 wirepieces are needed to reach the lower range of the target inductance and a minimum of 4 wirepieces are needed to reach one of the end locations. Therefore, the estimated total cost to get from node G to an end node is 6 ("Est.=6" in graph 602), which is greater than 4. As mentioned above, each wirepiece may add one unit of inductance. Accordingly, a wire having an inductance of 6 may be made of 6 wirepieces, for example.

As mentioned above, inductance is based on the geometry of the wire and it may be calculated using more complex formulas. The inductance calculations presented in this example are simplified for ease of illustration.

Node L is a distance of 4 away from node T, which is less than the minimum of 6 wirepieces needed to reach the lower range value of 6 of the target inductance range. Therefore, the estimated total cost for node L is 6.

Both node G and Node L have an estimated total cost of 6. In this example, node G is selected as the current node as shown in FIG. 7. This portion of the search corresponds to the "currentNode=openSet.PopCheapestItem( )" operation in the pseudocode above.

After selecting a current node, the search determined whether the node is one of the end location (e.g., a "goal"). This search functionality corresponds to the "if SearchGraph.IsGoal(currentNode):" operation in the pseudocode above. In this example, Node G is not an end goal and so the search continues as described below with respect to FIG. 7.

Figures 7A, 7B:
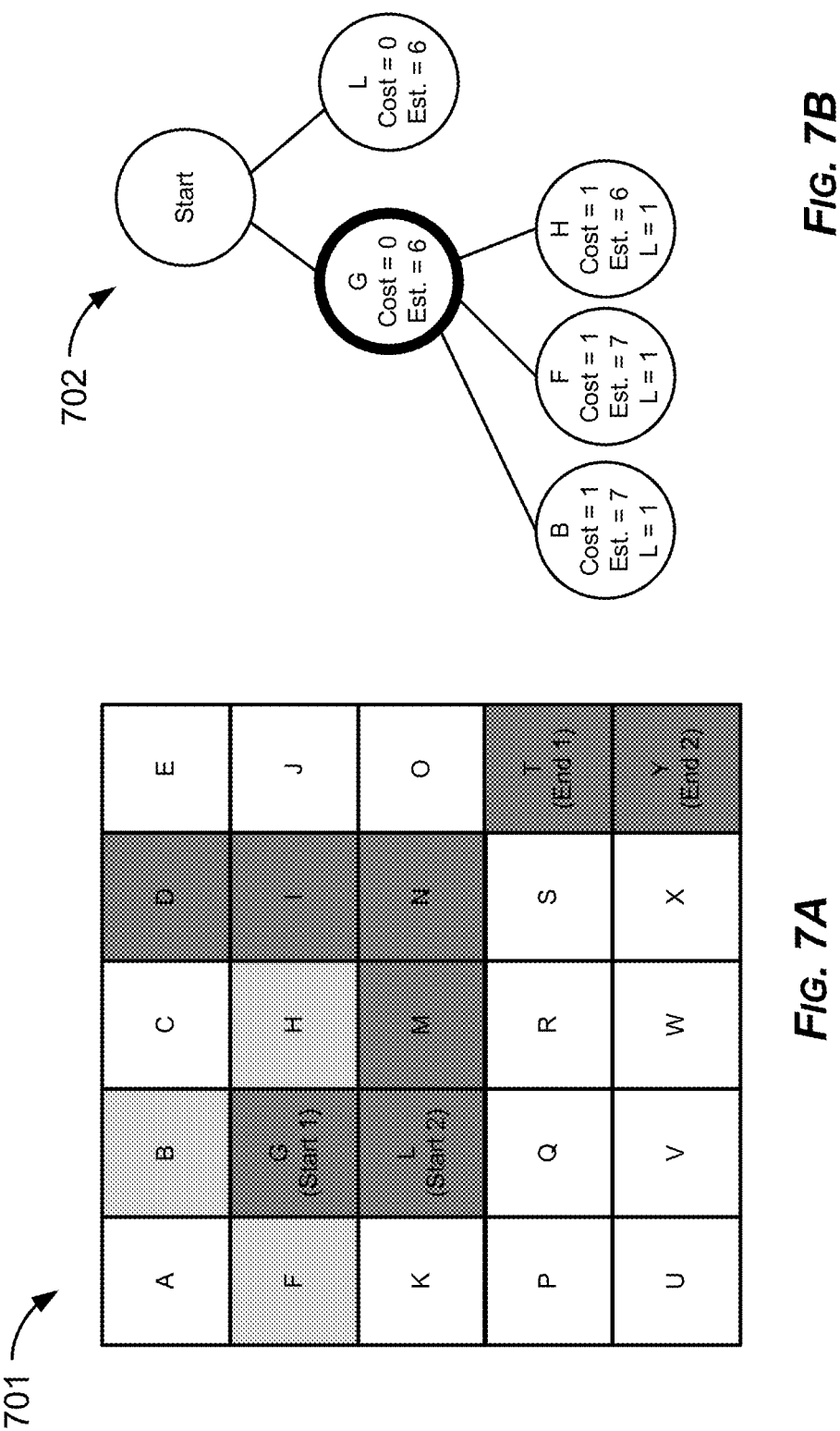
FIGS. 7A and 7B show a continuation of the search in FIGS. 6A and 6B.

FIGS. 7A and 7B show a continuation of the search in FIGS. 6A and 6B. The grid 701 and graph 702 show node G as the current node (thicker outline) and its neighboring nodes: node B, node F, and node H added to the graph 702. Nodes B, F, and H (filled with light gray in the grid 701) are considered neighbors of node G because they are adjacent (but not diagonal) to node G. The search functionality of adding neighbors to the search queue, including determining the costs to get to those nodes so far, corresponds to the pseudocode operation: "else for each edge from searchGraph.GetNeighbors(currentNode)."

While determining the neighbors of the current node, the search checks for a previous recorded cost for that location ("if previousRecordedCostForThisLocation>newCost:" in the pseudocode). As discussed above, the "location" of the node is not only based on physical location, but on the inductance of the wire as well. That is, inductance is a dimension of the node's location. Therefore, a node at the same physical location along a different path having a different inductance is considered a different location. If this node location is new or if it has a lower cost than a previous node in that location, then it is added to the open set (replacing any previous node's path).

The cost to get to a node may be based on the physical length of the wirepath so far. This is the "currentNode.cost." The "newCost" to get to each neighboring node of the current node may be "currentNode.cost+edge.cost." The estimated cost to reach one of the end locations for a neighbor node may be determined as "newCost+searchGraph.EstimateRemainingCost(newNode)". That is, the estimated code is determined by adding the cost to get to that node with an estimated remaining cost. The estimated remaining cost for the nodes may be based on positions of current nodes along the paths and a target inductance for the wire run. For example, the estimated total costs for each neighbor node to reach an end location may be determined based on a physical length of a wirepath of the current node ("currentNode.cost") added to a length to reach that neighbor ("edge.cost") from the current node. In some embodiments, the physical length of the wirepath may be based on a number of wirepieces that comprise the wirepath. In this example, each cell of the grid 701 corresponds to one wirepiece (with or without a via). Therefore, the "newCost" for Nodes B, F, and H are each 1 (0 currentNode.cost+1 edge.cost).

The estimated total cost for the node may also be based on the greater of an estimated physical distance to one of the one or more end locations and an estimated distance of additional wirepath needed to meet the target inductance. This estimated cost corresponds to the "searchGraph.EstimateRemainingCost(newNode)" function in the pseudocode above. In this example, the target inductance range is 6 to 7. As such, the target inductance is a range comprises a lower inductance (6) and a higher inductance (7). In some embodiments, the lower range of the range of target inductances is used in determining the additional wirepath needed to meet the target inductance. In this example, the lower range target inductance value of 6 is used for determining costs.

For node B, the estimated physical distance (e.g., rectilinear distance or Manhattan distance) to one of the one or more end locations is 6. As shown in the grid 701, certain cells are obstructed such that it is not possible to travel from node B to one of the end locations. Thus, the estimated physical distance is an estimate that underestimates the actual cost. Thus, the heuristic is said to be "admissible." For node B the current inductance is 1 (shown as "L=1" in graph 702). As mentioned above, the value of 6 is used for estimating the distance based on inductance. Therefore, the estimated distance of additional wirepath needed to meet the target inductance is 5 (6−1). Since 6 is greater than 5, the "searchGraph.EstimateRemainingCost(newNode)" for node B is 6. Therefore, the "newEstimatedTotalCost" is 7 (1+6).

For node F, the estimated physical distance to an end node is 6 and the estimated distance of additional wirepath needed to meet the target inductance is 5. Therefore, the "EstimateRemainingCost" of node F is 6 (6 is greater than 5) and its "newEstimatedTotalCost" is 7 (1+6).

For node H, the estimated physical distance to an end node is 4 and the estimated distance of additional wirepath needed to meet the target inductance to meet the target inductance is 5. Therefore, the "EstimateRemainingCost" is 5 (5>4) and the "newEstimatedTotalCost" for node H is 6 (1+5).

After creating nodes for each edge from the current node G, the search algorithm selects a node having the cheapest cost as the next currentNode and continues to iterate the process until the open set is empty ("While !openSet.empty( )") or until the current node is the end node ("if SearchGraph.IsGoal(currentNode): return currentNode.").

Figure 8B:
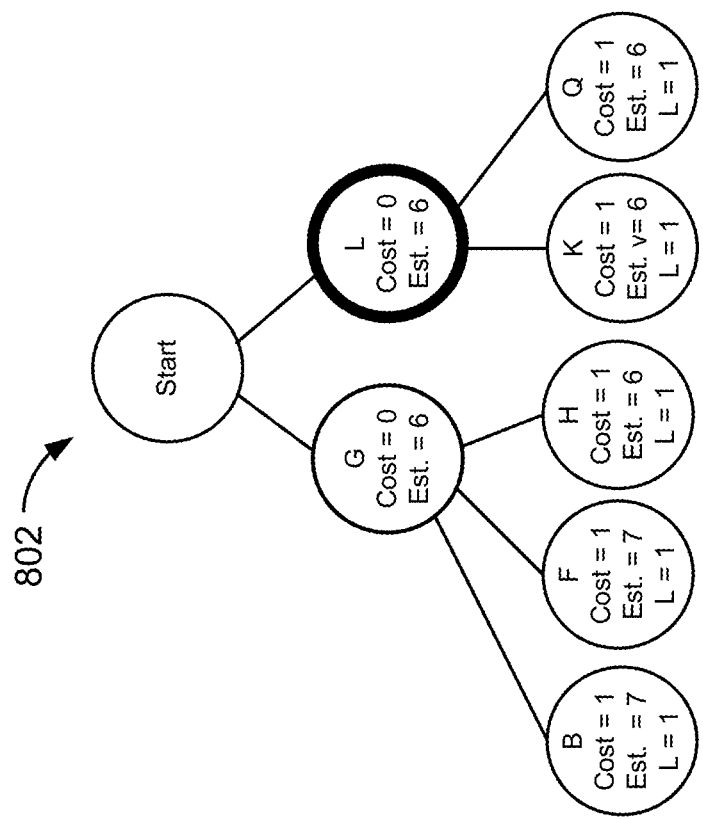
FIGS. 8A and 8B show a continuation of the search in FIGS. 7A and 7B.
Figure 8A:
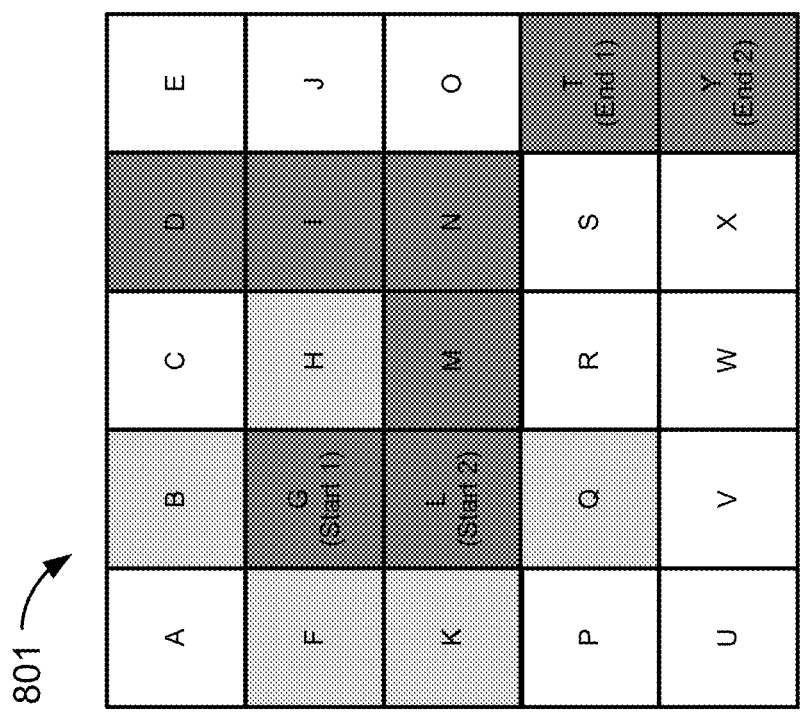

FIGS. 8A and 8B show a continuation of the search in FIGS. 7A and 7B. After adding nodes B, F, and H to the open set queue, the lowest cost node in the open set is node L (start 2) having a cost of 0. The process of adding nodes and determining their costs for node L is similar to the process discussed above with respect to node G. As such, the details of determining the costs are skipped. As shown in the grid 801 and graph 802, the neighbors of node L are node K and node Q. Node G and node M are adjacent to node L but are not valid neighbors because they are obstacles.

The "newCost" for node K is 1 (0+1), as 1 wirepiece has been used to route to node K. Accordingly, the inductance of node K is 1 ("L=1"). The EstimateRemainingCost of node K is the greater of 5 (distance to node T) and 5 (distance needed to reach the target inductance of 6). Therefore the "newEstimatedTotalCost" of node K is 6. As mentioned above, this example is simplified. In other embodiments the added cost for a node may be 1 multiplied by the cost to route in this direction, for example.

The "newCost" for node Q is 1 (0+1), as 1 wirepiece has been used to route to node Q. Accordingly, the inductance of node Q is 1 ("L=1"). The EstimateRemainingCost of node Q is the greater of 3 (distance to node T) and 5 (distance needed to reach the target inductance of 6). Therefore the "newEstimatedTotalCost" of node K is 6.

Figures 9A, 9B:
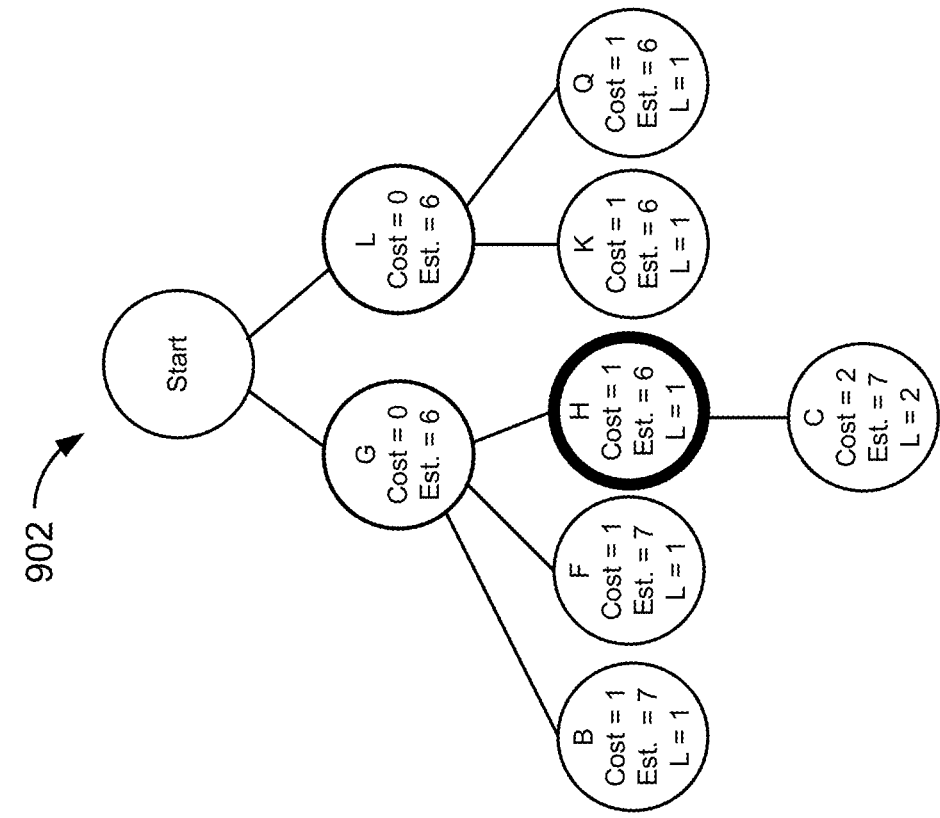
FIGS. 9A and 9B show a continuation of the search in FIGS. 8A and 8B.

FIGS. 9A and 9B show a continuation of the search in FIGS. 8A and 8B. After adding nodes K and Q to the open set queue, the lowest cost nodes in the open set are H, K, and Q having a cost of 6. In this example, node H may be selected as the current node. The process of adding nodes and determining their costs for node H is similar to the process discussed above. As such, the details of determining the costs are skipped. As shown in the grid 901 and graph 902, the neighbor of node H is node C. Nodes I, M, and G are adjacent to node H but are not valid neighbors because they are obstacles.

The "newCost" for node C is 2 (1+1), as 1 wirepiece has been used to route to node C from node H. Accordingly, the inductance of node C is 2 ("L=2"). The EstimateRemainingCost of node C is the greater of 5 (distance to node T) and 4 (distance needed to reach the target inductance of 6). Therefore the "newEstimatedTotalCost" of node K is 7 (2+5).

FIGS. 10A and 10B show a continuation of the search in FIGS. 9A and 9B. After adding node C to the open set queue, the lowest cost nodes in the open set are K and Q having a cost of 6. In this example, node K may be selected as the current node. The process of adding nodes and determining their costs for node K is similar to the process discussed above. As such, the details of determining the costs are skipped. As shown in the grid 1001 and graph 1002, the neighbors of node K are node F2 and node P. Nodes L is adjacent to node K but is not a valid neighbor because it is an obstacle. Furthermore, while node F2 is in the same physical location as node F, it is a different node because node F2 has an inductance of 2 while node F has an inductance of 1.

The "newCost" for node F2 is 2 (1+1), as 1 wirepiece has been used to route to node F2 from node K. Accordingly, the inductance of node F2 is 2 ("L=2"). The EstimateRemainingCost of node F2 is the greater of 6 (distance to node T) and 4 (distance needed to reach the target inductance of 6). Therefore the "newEstimatedTotalCost" of node K is 8 (2+6).

The "newCost" for node P is 2 (1+1), as 1 wirepiece has been used to route to node P from node K. Accordingly, the inductance of node P is 2 ("L=2"). The EstimateRemainingCost of node P is the greater of 4 (distance to node T) and 4 (distance needed to reach the target inductance of 6). Therefore the "newEstimatedTotalCost" of node P is 6 (2+4).

Figure 11B:
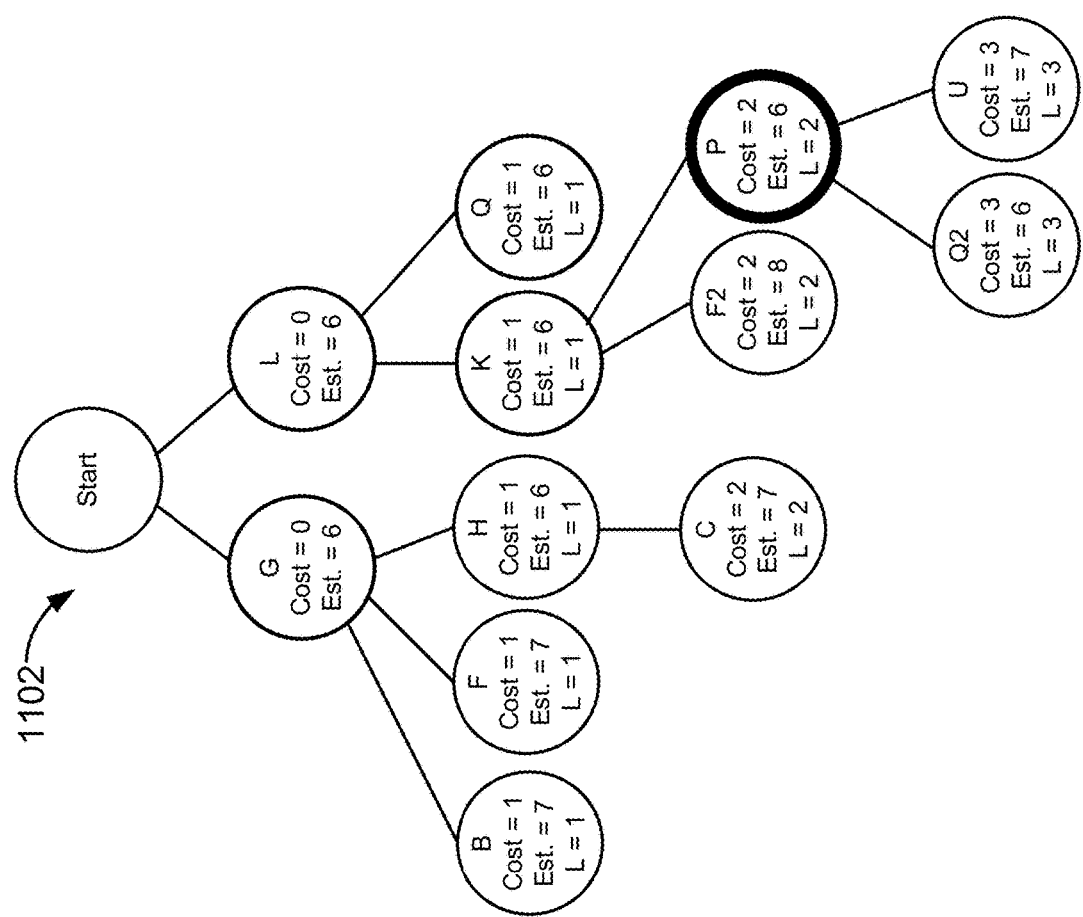
FIGS. 11A and 11B show a continuation of the search in FIGS. 10A and 10B.
Figure 11A:
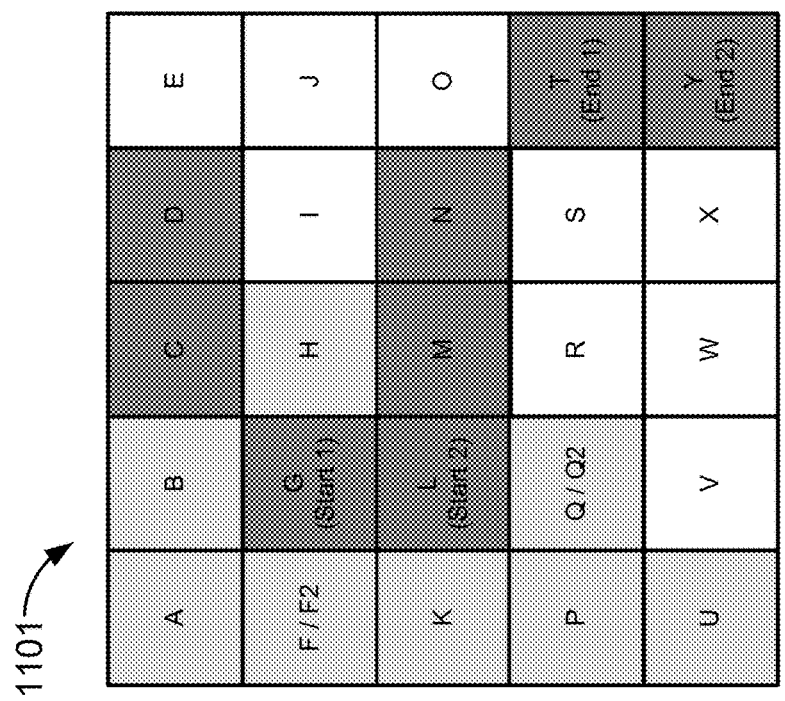

FIGS. 11A and 11B show a continuation of the search in FIGS. 10A and 10B to the end. After adding node F2 and node P to the open set queue, the lowest cost nodes in the open set are P and Q having a cost of 6. In this example, node P may be selected as the current node. The process of adding nodes and determining their costs for node P is similar to the process discussed above. As such, the details of determining the costs are skipped. As shown in the grid 1101 and graph 1102, the neighbors of node Q2 are node and node U. Furthermore, while node Q2 is in the same physical location as node Q, it is a different node because node Q2 has an inductance of 3 while node Q has an inductance of 1.

The "newCost" for node Q2 is 3 (2+1), as 1 wirepiece has been used to route to node Q2 from node P. Accordingly, the inductance of node Q2 is 3 ("L=3"). The EstimateRemainingCost of node Q2 is the greater of 3 (distance to node T) and 3 (distance needed to reach the target inductance of 6). Therefore the "newEstimatedTotalCost" of node K is 6 (3+3).

The "newCost" for node U is 3 (2+1), as 1 wirepiece has been used to route to node U from node P. Accordingly, the inductance of node U is 3 ("L=3"). The EstimateRemainingCost of node U is the greater of 4 (distance to node Y) and 3 (distance needed to reach the target inductance of 6). Therefore the "newEstimatedTotalCost" of node K is 7 (3+4).

Figure 12B:
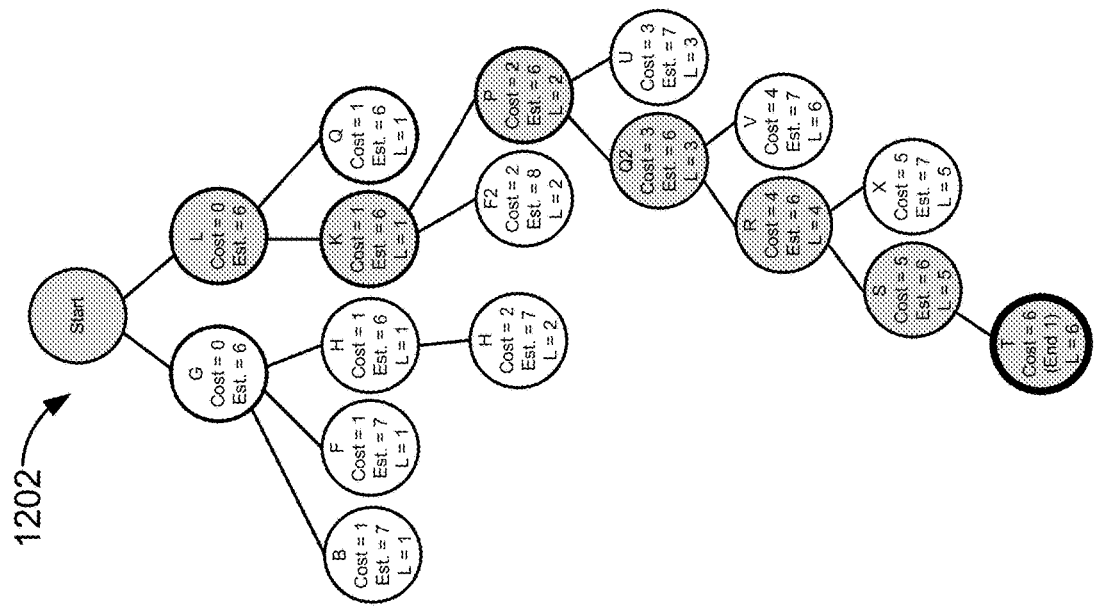
FIGS. 12A and 12B show a continuation of the search in FIGS. 11A and 11B to the end node.
Figure 12A:
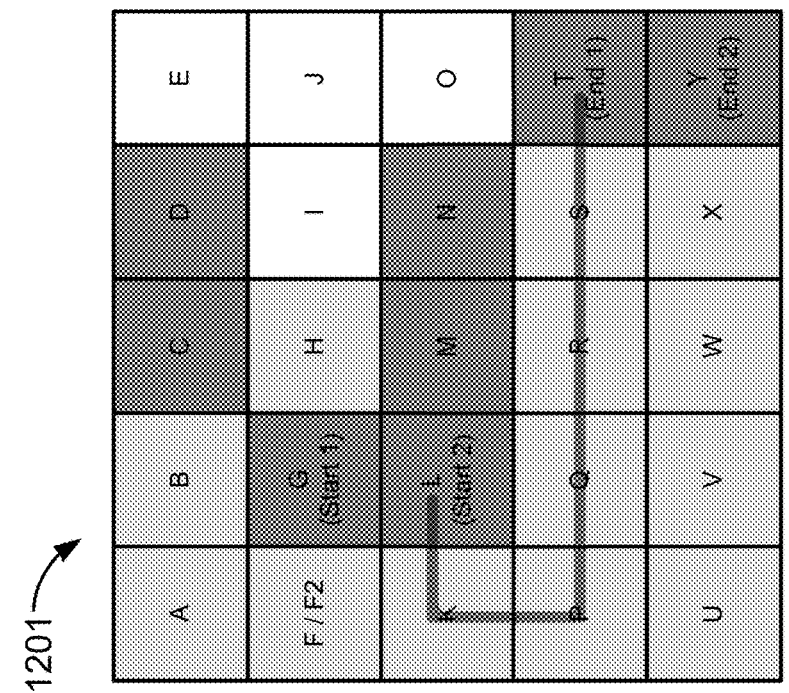

FIGS. 12A and 12B show a continuation of the search in FIGS. 11A and 11B to the end. After adding node Q2 and node U to the open set queue, the lowest cost nodes in the open set are Q2 and Q having a cost of 6. In this example, node Q2 may have been selected as the current node, then node R, then node S, and then node T. The process of adding nodes and determining their costs for nodes R, S, and T is similar to the process discussed above. As such, the details of determining the costs are skipped. As shown in the grid 1201 and graph 1202, node T is an end node and the path from node G (Start 1) to node T (End 1) routes through nodes L, K, P, Q2, R, S, and T. This subset of the plurality of nodes forms a final path between the one of the one or more start locations (node G and node L) and one of the one or more end locations (node T and node Y). The cost of the final path being a lowest cost of the plurality of costs while an inductance of the final path (L=6) meets the target inductance of 6.

Example Computer System

Figure 13:
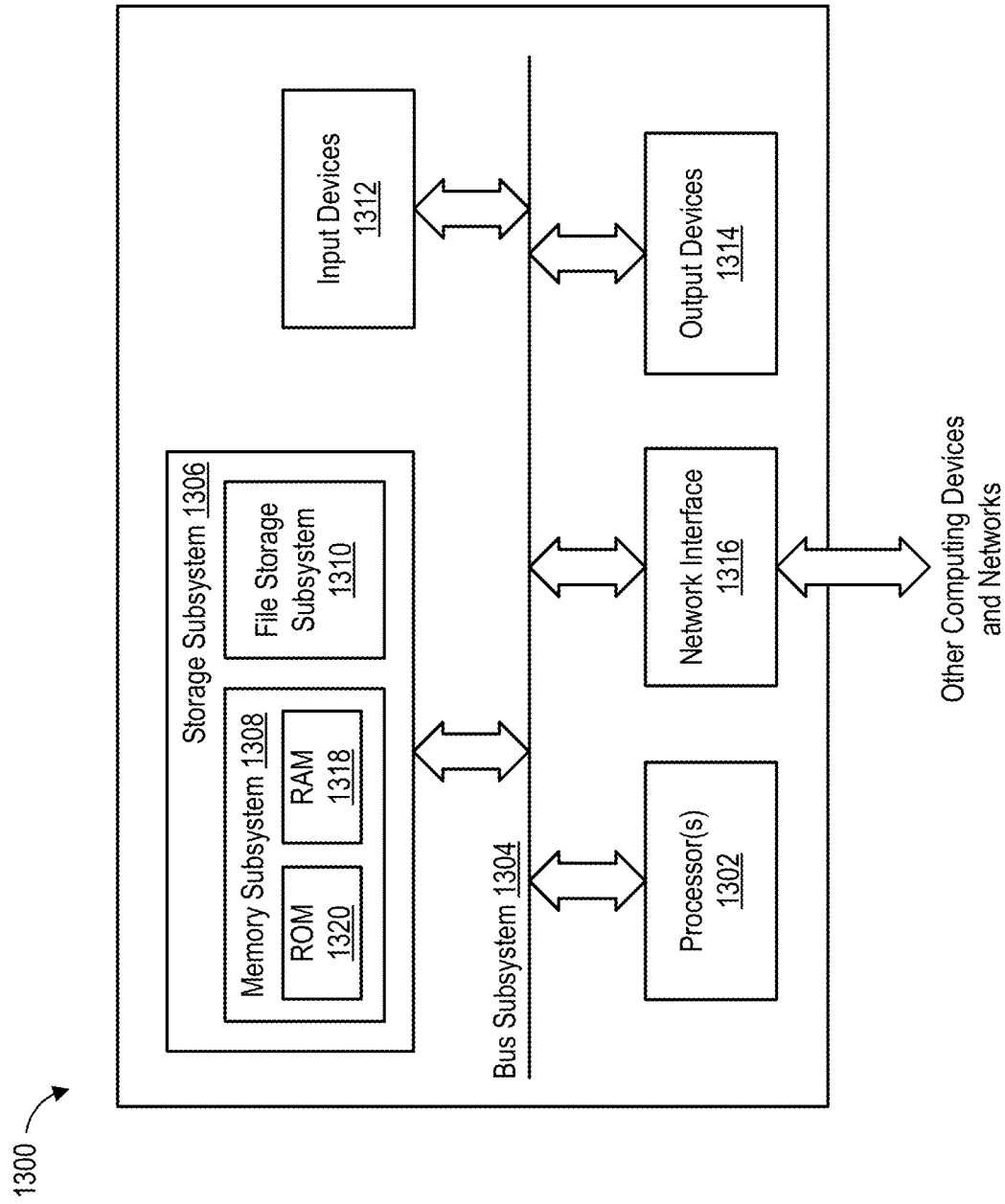
FIG. 13 is a block diagram of a computer system, according to an embodiment.

FIG. 13 is a block diagram 1300 of a computer system, according to an embodiment. The computer system may implement the superconducting wire routing techniques described herein. The computer system 1300 includes one or more processors 1302 that communicate with a number of peripheral devices via a bus subsystem 1304. These peripheral devices may include a storage subsystem 1306 (e.g., comprising a memory subsystem 1308 and a file storage subsystem 1310) and a network interface subsystem 1316. Some computer systems may further include user interface input devices 1312 and/or user interface output devices 914.

Bus subsystem 1304 can provide a mechanism for letting the various components and subsystems of computer system 1300 communicate with each other as intended. Although bus subsystem 1304 is shown schematically as a single bus, alternative embodiments of the bus subsystem can utilize multiple busses.

Network interface subsystem 1316 can serve as an interface for communicating data between computer system 1300 and other computer systems or networks. Embodiments of network interface subsystem 1316 can include, e.g., Ethernet, a Wi-Fi and/or cellular adapter, a modem (telephone, satellite, cable, ISDN, etc.), digital subscriber line (DSL) units, and/or the like.

Storage subsystem 1306 includes a memory subsystem 1308 and a file/disk storage subsystem 1310. Subsystems 1308 and 1310 as well as other memories described herein are examples of non-transitory computer-readable storage media that can store executable program code and/or data that provide the functionality of embodiments of the present disclosure.

Memory subsystem 1308 includes a number of memories including a main random-access memory (RAM) 1318 for storage of instructions and data during program execution and a read-only memory (ROM) 1320 in which fixed instructions are stored. File storage subsystem 1310 can provide persistent (e.g., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art. It should be appreciated that computer system 1300 is illustrative and many other configurations having more or fewer components than computer system 1300 are possible.

Further Example Embodiments

In various embodiments, the present disclosure provides a computer system comprising one or more processors and a non-transitory computer readable storage medium coupled to the one or more processors. The storage medium having stored thereon program code is executable by the one or more processors to receive one or more start locations and one or more end locations for a run of a superconducting wire in a circuit. The program code is further executable to iteratively determine a plurality of costs for a plurality of nodes forming paths from the one or more start locations to the one or more end locations. The costs are based on positions of current nodes along the paths and a target inductance for the wire run. The program code is further executable to iteratively store the plurality of costs in memory. The program code further executable to select a subset of the plurality of nodes forming a final path between one of the one or more start locations and one of the one or more end locations, where the cost of the final path is the lowest cost of the plurality of costs and an inductance of the final path meets the target inductance.

In some embodiments, the plurality of costs are determined based on a physical length of a wirepath, an estimated physical distance to one of the one or more end locations, a current inductance of the wirepath, and an estimated distance of additional wirepath needed to meet the target inductance. In some embodiments, the physical length of the wirepath is based on a number of wirepieces that comprise the wirepath.

In some embodiments, the target inductance is a range comprising a lower inductance and a higher inductance.

In some embodiments, the program code is further executable by the one or more processors to add the one or more start locations to a search set and iteratively add neighboring nodes to the search set if the neighboring nodes a meet a set of constraints and would not exceed the target inductance.

In some embodiments, the one or more start locations correspond to pins of a Josephson junction or pins of a device, and wherein the one or more end locations correspond to pins of another Josephson junction or pins of another device.

In some embodiments, the memory is a priority queue.

In some embodiments, a current node is not stored in memory if an inductance from a current start location to the current node exceeds a threshold or if a constraint is violated.

In some embodiments, the costs are further based on a number of vias along the paths or a preferred direction for a layer, the vias connecting layers of the circuit.

In some embodiments, the program code is further executable by the one or more processors to determine a first cost based on a minimum length of wire between a current node and the end location, determine a second cost based on a minimum length of wire to meet the target inductance, and select a greater of the first cost and second cost as a cost of the current node. In some such embodiments, the target inductance used to determine the second cost is an inductance value at an upper range of a range of target inductances. In some such embodiments, the program code is further executable by the one or more processors to determine, when the first cost is selected, if an inductance corresponding to the minimum length of wire between the current node and the end location exceeds a threshold. In some embodiments, this threshold may be an upper range value of the target inductance range. In some such embodiments, a current node is invalidated if an inductance corresponding to the minimum length of wire between the current node and the end location exceeds the threshold. In some such embodiments, the first cost and the second cost are determined for a plurality of target nodes and the program code is further executable by the one or more processors to select a lowest one of the plurality of costs corresponding to one target node of the plurality of target nodes.

In some embodiments, a first cost and a second cost are determined for a plurality of target nodes and the program code is further executable by the one or more processors to select a lowest one of the plurality of costs corresponding to one target node of the plurality of target nodes.

In some embodiments, the plurality of costs for the plurality of nodes forming paths from the one or more start locations to the one or more end locations are determined based on a maximum width for the superconducting wire.

In various embodiments, the present disclosure provides a method for routing superconducting wire in a superconducting circuit. The method includes receiving one or more start locations and one or more end locations for a wire run. The method further includes iteratively determining a plurality of costs for a plurality of nodes forming paths from the one or more start locations to the one or more end locations. The costs are based on positions of current nodes along the paths and a target inductance for the wire run. The method further includes iteratively storing the plurality of costs in memory. The method further includes selecting a subset of the plurality of nodes forming a final path between one of the one or more start locations and one of the one or more end locations, where the cost of the final path is the lowest of the plurality of costs and an inductance of the final path meets the target inductance.

In some embodiments, the plurality of costs are determined based on a physical length of a wirepath, an estimated physical distance to one of the one or more end locations, a current inductance of the wirepath, and an estimated distance of additional wirepath needed to meet the target inductance.

In various embodiments, the present disclosure provides a non-transitory computer readable storage medium having stored thereon program code executable by a computer system. The program code executable by the computer system to receive one or more start locations and one or more end locations for a wire run. The program code further executable to iteratively determine a plurality of costs for a plurality of nodes forming paths from the one or more start locations to the one or more end locations. The costs are based on positions of current nodes along the paths and a target inductance for the wire run. The program code further executable to iteratively store the plurality of costs in memory. The program code further executable to select a subset of the plurality of nodes, the subset forming a final path between one of the one or more start locations and one of the one or more end locations, where the cost of the final path is the lowest of the plurality of costs and an inductance of the final path meets the target inductance.

In some embodiments, the plurality of costs are determined based on a physical length of a wirepath, an estimated physical distance to one of the one or more end locations, a current inductance of the wirepath, and an estimated distance of additional wirepath needed to meet the target inductance.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations, and equivalents may be employed without departing from the scope of the present disclosure as defined by the claims.

What is claimed is:

1. A computer system comprising:
one or more processors; and
a non-transitory computer readable storage medium coupled to the one or more processors and having stored thereon program code executable by the one or more processors to:
receive one or more start locations and one or more end locations for a run of a superconducting wire in a circuit;
iteratively determine a plurality of costs for a plurality of nodes forming paths from the one or more start locations to the one or more end locations, wherein the costs are based on positions of current nodes along the paths and a target inductance for the wire run;
iteratively store the plurality of costs in memory; and
select a subset of the plurality of nodes forming a final path between one of the one or more start locations and one of the one or more end locations, a cost of the final path being a lowest cost of the plurality of costs, an inductance of the final path meeting the target inductance.

2. The computer system of claim 1, wherein the plurality of costs are determined based on a physical length of a wirepath, an estimated physical distance to one of the one or more end locations, a current inductance of the wirepath, and an estimated distance of additional wirepath needed to meet the target inductance.

3. The computer system of claim 2, wherein the physical length of the wirepath is based on a number of wirepieces that comprise the wirepath.

4. The computer system of claim 1, wherein the target inductance is a range comprising a lower inductance and a higher inductance.

5. The computer system of claim 1,
wherein the program code is further executable by the one or more processors to:
add the one or more start locations to a search set; and
iteratively add neighboring nodes to the search set if the neighboring nodes a meet a set of constraints and would not exceed the target inductance.

6. The computer system of claim 1, wherein the one or more start locations correspond to pins of a Josephson junction or pins of a device, and wherein the one or more end locations correspond to pins of another Josephson junction or pins of another device.

7. The computer system of claim 1, wherein the memory is a priority queue.

8. The computer system of claim 1, wherein a current node is not stored in memory if an inductance from a current start location to the current node exceeds a threshold or if a constraint is violated.

9. The computer system of claim 1, wherein the costs are further based on a number of vias along the paths or a preferred direction for a layer, the vias connecting layers of the circuit.

10. The computer system of claim 1, wherein the program code is further executable by the one or more processors to:
determine a first cost based on a minimum length of wire between a current node and the end location;
determine a second cost based on a minimum length of wire to meet the target inductance; and
select a greater of the first cost and second cost as a cost of the current node.

11. The computer system of claim 10, wherein the target inductance used to determine the second cost is an inductance value at a lower range of a range of target inductances.

12. The computer system of claim 10, wherein the program code is further executable by the one or more processors to:
determine, when the first cost is selected, if an inductance corresponding to the minimum length of wire between the current node and the end location exceeds a threshold.

13. The computer system of claim 10, wherein a current node is invalidated if an inductance corresponding to the minimum length of wire between the current node and the end location exceeds the threshold or if a constraint is violated.

14. The computer system of claim 10, wherein the first cost and the second cost are determined for a plurality of target nodes, wherein the program code is further executable by the one or more processors to:
select a lowest one of the plurality of costs corresponding to one target node of the plurality of target nodes.

15. The computer system of claim 1, wherein a first cost and a second cost are determined for a plurality of target nodes, wherein the program code is further executable by the one or more processors to:
select a lowest one of the plurality of costs corresponding to one target node of the plurality of target nodes.

16. The computer system of claim 1, wherein the plurality of costs for the plurality of nodes forming paths from the one or more start locations to the one or more end locations are determined based on a maximum width for the superconducting wire.

17. A method for routing superconducting wire in a superconducting circuit, the method comprising:
receiving one or more start locations and one or more end locations for a wire run;
iteratively determining a plurality of costs for a plurality of nodes forming paths from the one or more start locations to the one or more end locations, wherein the costs are based on positions of current nodes along the paths and a target inductance for the wire run;
iteratively storing the plurality of costs in memory; and
selecting a subset of the plurality of nodes, the subset forming a final path between one of the one or more start locations and one of the one or more end locations, wherein a cost of the final path is the lowest of the plurality of costs and an inductance of the final path meets the target inductance.

18. The method of claim 17, wherein the plurality of costs are determined based on a physical length of a wirepath, an estimated physical distance to one of the one or more end locations, a current inductance of the wirepath, and an estimated distance of additional wirepath needed to meet the target inductance.

19. A non-transitory computer readable storage medium having stored thereon program code executable by a computer system, the program code executable by the computer system to:
receive one or more start locations and one or more end locations for a wire run;
iteratively determine a plurality of costs for a plurality of nodes forming paths from the one or more start locations to the one or more end locations, wherein the costs are based on positions of current nodes along the paths and a target inductance for the wire run;
iteratively store the plurality of costs in memory; and select a subset of the plurality of nodes, the subset forming a final path between one of the one or more start locations and one of the one or more end locations, wherein a cost of the final path is the lowest of the plurality of costs and an inductance of the final path meets the target inductance.

20. The non-transitory computer readable storage medium of claim 19, wherein the plurality of costs are determined based on a physical length of a wirepath, an estimated physical distance to one of the one or more end locations, a current inductance of the wirepath, and an estimated distance of additional wirepath needed to meet the target inductance.

* * * * *